US011063113B2

(12) United States Patent
Lu et al.

(10) Patent No.: US 11,063,113 B2
(45) Date of Patent: Jul. 13, 2021

(54) CAPACITOR AND METHOD FOR FABRICATING THE SAME

(71) Applicant: SHENZHEN WEITONGBO TECHNOLOGY CO., LTD., Shenzhen (CN)

(72) Inventors: Bin Lu, Shenzhen (CN); Jian Shen, Shenzhen (CN)

(73) Assignee: SHENZHEN WEITONGBO TECHNOLOGY CO., LTD., Shenzhen (CN)

(*) Notice: Subject to any disclaimer, the term of this patent is extended or adjusted under 35 U.S.C. 154(b) by 17 days.

(21) Appl. No.: 16/659,564

(22) Filed: Oct. 21, 2019

(65) Prior Publication Data
US 2020/0052064 A1   Feb. 13, 2020

Related U.S. Application Data

(63) Continuation of application No. PCT/CN2018/099631, filed on Aug. 9, 2018.

(51) Int. Cl.
*H01L 21/00* (2006.01)
*H01L 49/02* (2006.01)

(52) U.S. Cl.
CPC .................. *H01L 28/92* (2013.01)

(58) Field of Classification Search
CPC ........................................... H01L 28/92
See application file for complete search history.

(56) References Cited

U.S. PATENT DOCUMENTS

| 8,085,524 | B2 | 12/2011 | Roozeboom et al. |
| 8,298,906 | B2* | 10/2012 | Bernstein .......... H01L 21/76898 |
| | | | 438/386 |
| 8,674,423 | B2* | 3/2014 | Collins ................. H01L 23/642 |
| | | | 257/301 |
| 9,105,759 | B2 | 8/2015 | Chou et al. |

(Continued)

FOREIGN PATENT DOCUMENTS

| CN | 101341576 B | 5/2012 |
| CN | 102569250 A | 7/2012 |

(Continued)

*Primary Examiner* — Richard A Booth
(74) *Attorney, Agent, or Firm* — Scully Scott Murphy & Presser

(57) ABSTRACT

A capacitor is disclosed, including: a semiconductor substrate including opposite upper and lower surfaces; one first trench disposed in the semiconductor substrate and formed downward from the upper surface; one second trench disposed in the substrate and corresponding to the first trench, and formed upward from the lower surface; a first conductive layer disposed above the substrate and in the first trench; a first insulating layer disposed between the substrate and the first conductive layer; a second conductive layer disposed on the substrate and in the first trench, the second conductive layer being electrically connected to the substrate; a second insulating layer disposed between the second conductive layer and the first conductive layer; a third conductive layer disposed below the substrate and in the second trench; and a third insulating layer disposed between the third conductive layer and the substrate, which is electrically connected to the first conductive layer.

20 Claims, 15 Drawing Sheets

(56) References Cited

U.S. PATENT DOCUMENTS

| | | |
|---|---|---|
| 9,397,152 B2 | 7/2016 | Cheng et al. |
| 2008/0291601 A1 | 11/2008 | Roozeboom et al. |
| 2009/0267183 A1 | 10/2009 | Temple et al. |
| 2011/0065253 A1* | 3/2011 | Huang .................... H01L 28/90 |
| | | 438/386 |
| 2014/0015102 A1 | 1/2014 | Bar et al. |
| 2016/0020267 A1 | 1/2016 | Lin |
| 2017/0104057 A1 | 4/2017 | Voiron |

FOREIGN PATENT DOCUMENTS

| | | |
|---|---|---|
| CN | 102610659 A | 7/2012 |
| CN | 102683318 A | 9/2012 |
| CN | 103022019 A | 4/2013 |
| CN | 103346148 A | 10/2013 |
| CN | 104115270 A | 10/2014 |
| CN | 108335988 A | 7/2018 |

* cited by examiner

US 11,063,113 B2

CAPACITOR AND METHOD FOR FABRICATING THE SAME

CROSS REFERENCE TO RELATED APPLICATIONS

The present application is a continuation of international application No. PCT/CN2018/099631, filed on Aug. 9, 2018, which is hereby incorporated by reference in its entirety.

TECHNICAL FIELD

The present application relates to the field of capacitors, and more particularly, to a capacitor and a method for fabricating the same.

BACKGROUND

A capacitor can play a role of bypassing, filtering, decoupling, or the like in a circuit, which is an indispensable part of ensuring a normal operation of the circuit. A silicon capacitor is a capacitor manufactured on a silicon wafer using semiconductor processing techniques. Compared with a traditional planar silicon capacitor, a 3 Dimensions (3D) silicon capacitor increases a surface area by processing a 3D structure such as a deep hole and a trench on a substrate, and a capacitance density thereof can reach more than 20 times that of a plate silicon capacitor. At present stage, based on a concept of multi-layer nesting in the manufacture of a dynamic random access memory (DRAM), a 3D silicon capacitor is fabricated by alternately depositing a conductor and an insulator material on a surface of a 3D structure to form a plurality of vertically stacked capacitor structures, then connecting all the capacitors in parallel by different connection manners on the front side of a silicon substrate to finally form a capacitor with a large capacitance value. However, the 3D silicon capacitor fabricated by the above method needs to undergo multiple photolithography steps (including exposure, development, and etching) on the front side of a wafer, which requires not only higher pattern alignment precision, but also results in problems such as low reliability and short circuit of a capacitor since a material film to be fabricated first is easily destroyed due to exposure to a corrosive gas and solution in a subsequent photolithography process.

SUMMARY

The present application provides a capacitor and a method for fabricating the same. A photolithography step is performed separately on both sides of a semiconductor substrate (silicon wafer) by processing both front and back sides, thereby reducing alignment difficulty of multiple photolithography, and meanwhile, a capacitance density could be further increased by fabricating a capacitor structure on the back side of the semiconductor substrate.

In a first aspect, provided is a capacitor, the capacitor including:

a semiconductor substrate (101) including an upper surface and a lower surface opposite to the upper surface;

at least one first trench (108) disposed in the semiconductor substrate (101) and formed downward from the upper surface;

at least one second trench (109) disposed in the semiconductor substrate (101) and corresponding to the first trench (108), and formed upward from the lower surface;

a first conductive layer (103) disposed above the semiconductor substrate (101) and in the first trench (108);

a first insulating layer (102) disposed between the semiconductor substrate (101) and the first conductive layer (103) to isolate the first conductive layer (103) from the semiconductor substrate (101);

a second conductive layer (105) disposed on the semiconductor substrate (101) and in the first trench (108), the second conductive layer (105) being electrically connected to the semiconductor substrate (101);

a second insulating layer (104) disposed between the second conductive layer (105) and the first conductive layer (103) to isolate the second conductive layer (105) from the first conductive layer (103);

a third conductive layer (107) disposed below the semiconductor substrate (101) and in the second trench (109); and a third insulating layer (106) disposed between the third conductive layer (107) and the semiconductor substrate (101) to isolate the third conductive layer (109) from the semiconductor substrate (101), the third conductive layer (107) being electrically connected to the first conductive layer (103).

Therefore, a capacitor provided by an embodiment of the present application is a wafer-level 3D silicon capacitor with characteristics of less size and high capacity. A photolithography step is performed separately on both sides of a semiconductor substrate (silicon wafer) by processing both front and back sides, thereby reducing alignment difficulty of multiple photolithography, and meanwhile, a capacitance density could be further increased by fabricating a capacitor structure on the back side of the semiconductor substrate.

The capacitor described in the embodiment of the present application possesses excellent performance and stability, and has a high capacitance density. At the same time, the capacitor described in the embodiment of the present application can play a role of bypassing, filtering, decoupling, or the like in a circuit.

Optionally, the semiconductor substrate is preferably an n-type or p-type heavily doped low-resistivity silicon wafer. A high-resistivity wafer may also be adopted, but after the first trench is fabricated, the upper surface (front side) of the semiconductor substrate and a surface of the first trench are required to be doped to form a heavily doped low-resistivity conductive layer.

In some possible implementation manners, at least one third trench (110) is disposed in the semiconductor substrate (101), the third trench (110) is formed upward from the lower surface of the semiconductor substrate (101), a depth of the third trench (110) is less than a thickness of the semiconductor substrate (101), and the third insulating layer (106) and the third conductive layer (107) are sequentially disposed in the at least one third trench (110).

In some possible implementation manners, any cross section of the third trench (110) parallel to the surfaces of the semiconductor substrate (101) in the semiconductor substrate (101) is the same as that of the second trench (109).

In some possible implementation manners, the second conductive layer (105) forms a downward recess between two adjacent first trenches (108) to block the second insulating layer (104) and be electrically connected to the semiconductor substrate (101); or the second conductive layer (105) is evenly disposed between two adjacent first trenches (108), and is isolated from the semiconductor substrate (101) by the second insulating layer (104).

In some possible implementation manners, a width of any cross section of the first trench (108) parallel to the surfaces of the semiconductor substrate (101) in the semiconductor substrate (101) is greater than that of the second trench (109).

In some possible implementation manners, the first trench (108) is aligned with the second trench (109).

In some possible implementation manners, a depth of the first trench (108) is greater than that of the second trench (109).

In some possible implementation manners, a depth of the first trench (108) is equal to a thickness of the semiconductor substrate (101), and a depth of the second trench (109) is equal to zero.

In some possible implementation manners, a projected area of the first insulating layer (102) on the semiconductor substrate (101) is the same as that of the first conductive layer (103), the projected area of the first insulating layer (102) on the semiconductor substrate (101) is less than that of the second insulating layer (104), and the projected area of the second insulating layer (104) on the semiconductor substrate (101) is less than that of the second conductive layer (105).

In some possible implementation manners, a projected area of the third insulating layer (106) on the semiconductor substrate (101) is greater than that of the third conductive layer (107).

In some possible implementation manners, at least one of the first insulating layer (102), the second insulating layer (104) and the third insulating layer (106) includes at least one of:

a silicon oxide layer, a silicon nitride layer, a metal oxide layer, and a metal nitride layer.

Optionally, at least one of the first insulating layer (102), the second insulating layer (104), and the third insulating layer (106) includes at least one of: a silicon dioxide layer, an aluminum oxide layer, a zirconium oxide layer, a hafnium oxide layer, a lead zirconate titanate ($PbZr_xTi_{1-x}O_3$, PZT) layer, and a calcium copper titanate ($CaCu_3Ti_4O_{12}$, CCTO) layer.

For example, at least one of the first insulating layer (102), the second insulating layer (104), and the third insulating layer (106) may be a stack of a material having a high dielectric constant, such as silicon dioxide/aluminum oxide/silicon dioxide ($SiO_2/Al_2O_3/SiO_2$).

It should be understood that at least one of the first insulating layer (102), the second insulating layer (104), and the third insulating layer (106) may be formed by bonding of a material having a high dielectric constant (relative permittivity or dielectric constant).

Therefore, the first insulating layer, the second insulating layer, and the third insulating layer described in the embodiment of the present application may be formed by bonding a material having a high dielectric constant, thereby making the capacitor described in the embodiment of the present application have a larger capacitance density.

In some possible implementation manners, at least one of the first conductive layer (103), the second conductive layer (105) and the third conductive layer (107) includes at least one of: a heavily doped polysilicon layer, a carbon-based material layer, a metal layer, and a titanium nitride layer.

In some possible implementation manners, the second conductive layer (105) is one electrode of the capacitor, and the third conductive layer (107) is the other electrode of the capacitor.

In a second aspect, provided is a method for fabricating a capacitor, including:

etching a semiconductor substrate to form at least one first trench in the semiconductor substrate, where the first trench is formed downward from an upper surface of the semiconductor substrate, and a depth of the first trench is less than a thickness of the semiconductor substrate;

depositing a first insulating layer on the upper surface of the semiconductor substrate and an inner surface of the at least one first trench;

depositing a first conductive layer on an upper surface and an inner surface of the first insulating layer;

performing photolithography processing on the first insulating layer and the first conductive layer to expose the upper surface of the semiconductor substrate;

depositing a second insulating layer on an upper surface and an inner surface of the first conductive layer, and the upper surface of the semiconductor substrate;

performing photolithography processing on the second insulating layer to expose the upper surface of the semiconductor substrate, where the second insulating layer covers the first insulating layer and the first conductive layer;

depositing a second conductive layer on an upper surface and an inner surface of the second insulating layer, and the upper surface of the semiconductor substrate;

etching the semiconductor substrate to form at least one second trench in one-to-one correspondence with the at least one first trench in the semiconductor substrate, where the second trench penetrates upward through the first insulating layer from a lower surface of the semiconductor substrate to expose the first conductive layer, or the second trench extends upward from a lower surface of the semiconductor substrate to the first insulating layer;

depositing a third insulating layer on the lower surface of the semiconductor substrate and an inner surface of the at least one second trench;

if the second trench penetrates through the first insulating layer, removing the third insulating layer deposited on the bottom of the at least one second trench to expose the first conductive layer, or if the second trench extends to the first insulating layer, removing the third insulating layer deposited on the bottom of the at least one second trench, and removing the first insulating layer deposited on the bottom of the at least one first trench to expose the first conductive layer; and depositing a third conductive layer on a lower surface and an inner surface of the third insulating layer.

Therefore, in the embodiment of the present application, by properly designing a pattern, a first prepared material film is covered and protected in a subsequent photolithography process, thereby reducing etching difficulty and improving process reliability.

In some possible implementation manners, before etching the semiconductor substrate, the method further includes:

performing thinning processing on the lower surface of the semiconductor substrate.

In some possible implementation manners, the method further includes:

etching the semiconductor substrate to form at least one third trench in the semiconductor substrate, where the third trench is upward from the lower surface of the semiconductor substrate, and a depth of the third trench is less than the thickness of the semiconductor substrate; and depositing the third insulating layer on an inner surface of the at least one third trench, and depositing the third conductive layer on the inner surface of the third insulating layer.

In some possible implementation manners, any cross section of the third trench parallel to the surfaces of the semiconductor substrate in the semiconductor substrate is the same as that of the second trench.

In some possible implementation manners, the method further includes:

performing photolithography processing on the third conductive layer to expose the lower surface of the semiconductor substrate.

In some possible implementation manners, on the upper surface of the semiconductor substrate, the second conductive layer between two adjacent first trenches is electrically connected to the semiconductor substrate.

In some possible implementation manners, a width of any cross section of the first trench parallel to the surfaces of the semiconductor substrate in the semiconductor substrate is greater than that of the second trench.

In some possible implementation manners, the first trench is aligned with the second trench.

In some possible implementation manners, the depth of the first trench is greater than that of the second trench.

In some possible implementation manners, the etching the semiconductor substrate includes:

etching the semiconductor substrate by deep reactive ion etching (DRIE).

In a third aspect, provided is a method for fabricating a capacitor, including:

etching a semiconductor substrate to form at least one first trench in the semiconductor substrate, where the first trench is downward from an upper surface of the semiconductor substrate, and a depth of the first trench is less than or equal to a thickness of the semiconductor substrate;

depositing a first insulating layer on the upper surface of the semiconductor substrate and an inner surface of the at least one first trench;

depositing a first conductive layer on an upper surface and an inner surface of the first insulating layer;

performing photolithography processing on the first insulating layer and the first conductive layer to expose the upper surface of the semiconductor substrate;

depositing a second insulating layer on an upper surface and an inner surface of the first conductive layer, and the upper surface of the semiconductor substrate;

performing photolithography processing on the second insulating layer to expose the upper surface of the semiconductor substrate, where the second insulating layer covers the first insulating layer and the first conductive layer;

depositing a second conductive layer on an upper surface and an inner surface of the second insulating layer, and the upper surface of the semiconductor substrate;

depositing a third insulating layer on a lower surface of the semiconductor substrate;

removing the third insulating layer under the at least one first trench to expose the first conductive layer; and depositing a third conductive layer on a lower surface and an inner surface of the third insulating layer.

Therefore, in the embodiment of the present application, by properly designing a pattern, a first prepared material film is covered and protected in a subsequent photolithography process, thereby reducing etching difficulty and improving process reliability.

In some possible implementation manners, when the depth of the first trench is less than the thickness of the semiconductor substrate, the method further includes:

performing thinning processing on the lower surface of the semiconductor substrate before depositing the third insulating layer on the lower surface of the semiconductor substrate.

In some possible implementation manners, the method further includes:

performing photolithography processing on the third conductive layer to expose the lower surface of the semiconductor substrate.

In some possible implementation manners, on the upper surface of the semiconductor substrate, the second conductive layer between two adjacent first trenches is electrically connected to the semiconductor substrate.

In some possible implementation manners, the etching the semiconductor substrate includes:

etching the semiconductor substrate by DRIE.

Therefore, according to a capacitor and a method for fabricating the same in an embodiment of the present application, a semiconductor substrate is provided with at least one first trench and at least one second trench in one-to-one correspondence with the at least one first trench; a first conductive layer and a second conductive layer are disposed on the semiconductor substrate and in the at least one first trench; a first insulating layer is disposed between the first conductive layer and the semiconductor substrate; a second insulating layer is disposed between the first conductive layer and the second conductive layer, and the second conductive layer is electrically connected to the semiconductor substrate; a third conductive layer is disposed below the semiconductor substrate and in the at least one second trench; and a third insulating layer is disposed between the third conductive layer and the semiconductor substrate, and the third conductive layer is electrically connected to the first conductive layer. Therefore, a photolithography step is performed separately on both sides of a semiconductor substrate by processing both front and back sides, thereby reducing alignment difficulty of multiple photolithography, and further, a capacitance density could be further increased by fabricating a capacitor structure on the back side of the semiconductor substrate.

DESCRIPTION OF EMBODIMENTS

Figure 1:
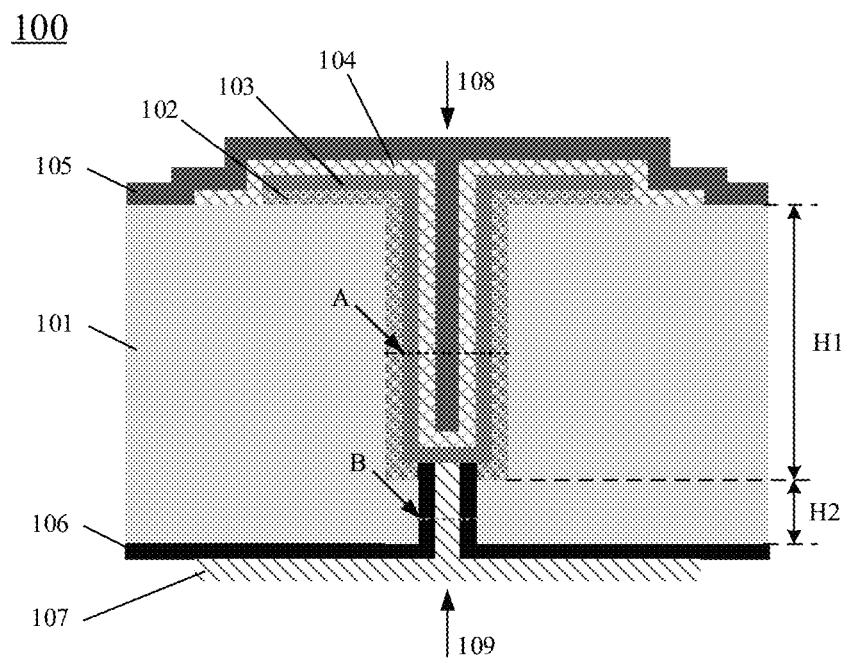
FIG. 1 is a schematic structural diagram of a capacitor according to an embodiment of the present application.

Technical solutions in embodiments of the present application will be described hereinafter with reference to accompanying drawings.

It should be understood that a capacitor of an embodiment of the present application can play a role of bypassing, filtering, decoupling, or the like in a circuit.

The capacitor described in the embodiment of the present application may be a 3D silicon capacitor which is a novel capacitor based on semiconductor wafer processing techniques. Compared with a traditional MLCC (multi-layer ceramic capacitor), the 3D silicon capacitor has advantages of small size, high precision, strong stability, and long lifetime. In a basic processing flow, a 3D structure with a high aspect ratio such as a deep hole, a trench, a pillar shape, a wall shape, or the like is required to be first processed on a wafer or substrate, and then an insulating film and a low-resistivity conductive material are deposited on a surface of the 3D structure to fabricate a lower electrode, an dielectric layer and an upper electrode of the capacitor, sequentially.

At present stage, based on a concept of multi-layer nesting in the manufacture of a DRAM, the 3D silicon capacitor is fabricated by alternately depositing a conductor and an insulator material on a surface of a 3D structure to form a plurality of vertically stacked capacitor structures, then connecting all the capacitors in parallel by different connection manners on the front side of a silicon substrate to finally form a capacitor with a large capacitance value. However, the 3D silicon capacitor fabricated by the above method needs to undergo multiple photolithography steps (including exposure, development, and etching) on the front side of a wafer, which requires not only higher pattern alignment precision, but also results in problems such as low reliability and short circuit of a capacitor since a material film to be fabricated first is easily destroyed due to exposure to a corrosive gas and solution in a subsequent photolithography process. In this context, the present application proposes a novel double-sided and multi-layer 3D capacitor structure and a method for fabricating the same in order to avoid the above disadvantages.

Specifically, a stacked capacitor structure including a conductive substrate, an insulating layer, a conductive layer, an insulating layer and a conductive layer is fabricated in a deep hole or a trench in a front side of a wafer. The intermediate conductive layer is then led out by digging the hole (or the trench) on a back side of the wafer.

Hereinafter, a capacitor according to an embodiment of the present application will be introduced in detail with reference to FIGS. 1 to 4. It should be understood that capacitors in FIGS. 1 to 4 are merely examples, and the number of first trenches, second trenches, and third trenches included in the capacitors is not limited to that included in the capacitors as shown in FIGS. 1 to 4, and may be determined according to actual needs. Meanwhile, in embodiments of FIGS. 1 to 4, description is made by an example where an extending direction of a trench is a direction perpendicular to a semiconductor substrate (wafer). In the embodiments of the present application, the extending direction of the trench may also be some other directions, for example, any direction satisfying that an angle with respect to the direction perpendicular to the semiconductor substrate (wafer) is less than a preset value.

It should be noted that in embodiments shown below, for structures shown in different embodiments, like structures are denoted by like reference numerals for ease of understanding, and detailed description of the same structures is omitted for brevity.

FIG. 1 is a possible structural diagram of a capacitor 100 according to an embodiment of the present application. As shown in FIG. 1, the capacitor 100 includes a semiconductor substrate 101, a first insulating layer 102, a first conductive layer 103, a second insulating layer 104, a second conductive layer 105, a third insulating layer 106, and a third conductive layer 107.

Specifically, the semiconductor substrate 101 includes an upper surface and a lower surface opposite to the upper surface.

The semiconductor substrate 101 is provided with at least one first trench 108 and at least one second trench 109 in one-to-one correspondence with the at least one first trench, a bottom of the first trench 108 is in communication with a bottom of the second trench 109, the first trench 108 extends (is formed) downward from the upper surface of the semiconductor substrate 101, and the second trench 109 extends (is formed) upward from the lower surface of the semiconductor substrate 101.

The first conductive layer 103 is disposed above the semiconductor substrate 101 and in the first trench 108; the first insulating layer 102 is disposed between the semiconductor substrate 101 and the first conductive layer 103, and the first insulating layer 102 isolates the first conductive layer 103 from the semiconductor substrate 101; the second conductive layer 105 is disposed on the semiconductor substrate 101 and in the first trench 108, and the second conductive layer 105 is electrically connected to the semiconductor substrate 101; the second insulating layer 104 is disposed between the second conductive layer 105 and the first conductive layer 103 to isolate the second conductive layer 105 from the first conductive layer 103; the third conductive layer 107 is disposed below the semiconductor substrate 101 and in the second trench 109; and the third insulating layer 106 is disposed between the third conductive layer 107 and the semiconductor substrate 101 to isolate the third conductive layer 109 from the semiconductor substrate 101, and the third conductive layer 107 is electrically connected to the first conductive layer 103.

It should be noted that, in the embodiment of the present application, sizes of cross sections of the first trench 108 and the second trench 109 are not limited. For example, the trench may be a hole with a small difference between length and width of a cross section, or a trench with a large difference between length and width. Here, the cross section may be understood as a section parallel to the surfaces of the semiconductor substrate, and FIG. 1 shows a section along a longitudinal direction of the semiconductor substrate.

It should be understood that the insulating layer in the embodiment of the present application may also be referred to as a dielectric layer.

It should be noted that the second conductive layer 105 may serve as one electrode of the capacitor 100, and the third conductive layer 107 may serve as the other electrode of the capacitor 100.

In a specific implementation, in the capacitor 100, for example, only one first trench 108 and one second trench 109 are provided, and the semiconductor substrate 101, the first insulating layer 102 and the first conductive layer 103 may constitute a capacitor A (capacitance C1). The first conductive layer 103, the second insulating layer 104, and the second conductive layer 105 may constitute a capacitor B (capacitance C2). The third conductive layer 107, the third insulating layer 106 and the semiconductor substrate 101 may constitute a capacitor C (capacitance C3). The capacitor A, the capacitor B and the capacitor C are connected in parallel, and therefore, capacitance C of the capacitor 100 may be equivalent capacitance of the capacitor A, the capacitor B, and the capacitor C in parallel, that is, C=C1+C2+C3. The second conductive layer 105 and the third conductive layer 107 serve as common electrodes of the three parallel capacitors, respectively.

In a specific implementation, extending directions of the first trench 108 and the second trench 109 may be the same or different, as long as the third conductive layer 107 is ensured to be electrically connected to the first conductive layer 103. Similarly, extending directions of different first trenches 108 may be the same or different, and extending directions of different second trenches 109 may be the same or different.

Preferably, the first trench 108 is aligned with the second trench 109. That is, the extending directions of the first trench 108 and the second trench 109 are the same. In other words, a central axis of the first trench 108 coincides with that of the second trench 109 (FIG. 1 shows just the case of coincidence of central axes).

Optionally, the semiconductor substrate 101 is preferably an n-type or p-type heavily doped low-resistivity silicon wafer. A high-resistivity wafer may also be adopted, but after the first trench is fabricated, the upper surface (front side) of the semiconductor substrate 101 and a surface of the first trench 108 are required to be doped to form a heavily doped low-resistivity conductive layer.

Optionally, in the embodiment of the present application, a width of any cross section of the first trench 108 in the semiconductor substrate 101 is greater than that of the second trench 109. That is, in any cross section of the semiconductor substrate 101, the width of the first trench 108 is greater than the width of the second trench 109, for example, as shown in FIG. 1, a width of a cross section A of the first trench 108 is greater than a width of a cross section B of the second trench 109. The width here is a size of an opening of a trench, which may refer to the maximum width of the trench.

In the embodiment of the present application, shapes of cross sections of a plurality of first trenches 108 disposed in the semiconductor substrate 101 may be the same or different, and similarly, shapes of cross sections of a plurality of second trenches 109 disposed in the semiconductor substrate 101 may be the same or different.

Optionally, in the embodiment of the present application, a depth of the first trench 108 is greater than that of the second trench 109. For example, as shown in FIG. 1, in the semiconductor substrate 101, a depth H1 of the first trench 108 is greater than a depth H2 of the second trench 109.

It should be noted that depth and width of the first trench 108 may be flexibly set according to actual needs. Similarly, a depth of the second trench 109 may also be flexibly set according to actual needs.

Optionally, in the embodiment of the present application, at least one of the first insulating layer 102, the second insulating layer 104, and the third insulating layer 106 includes at least one of: a silicon dioxide layer, an aluminum oxide layer, a zirconium oxide layer, a hafnium oxide layer, a lead zirconate titanate ($PbZr_xT_{1-x}O_3$, PZT) layer, and a calcium copper titanate ($CaCu_3Ti_4O_{12}$, CCTO) layer. A specific insulating material and a layer thickness may be adjusted according to a capacitance value, a frequency characteristic, a loss and other requirements of a capacitor. Of course, at least one of the first insulating layer 102, the second insulating layer 104, and the third insulating layer 106 may further include some other material layers having high dielectric constant characteristics, which are not limited in the embodiment of the present application.

For example, the first insulating layer 102 may be a stack of a material having a high dielectric constant, such as silicon dioxide/aluminum oxide/silicon dioxide ($SiO_2$/$Al_2O_3$/$SiO_2$).

It should be noted that the first insulating layer 102, the second insulating layer 104, and the third insulating layer 106 may be formed by bonding of one or more materials having a high dielectric constant (relative permittivity or dielectric constant).

Therefore, the first insulating layer, the second insulating layer, and the third insulating layer described in the embodiment of the present application may be formed by bonding a material of a high dielectric constant, thereby making the capacitor described in the embodiment of the present application have a larger capacitance density.

Optionally, in the embodiment of the present application, at least one of the first conductive layer 103, the second conductive layer 105, and the third conductive layer 107 includes at least one of: a heavily doped polysilicon layer, a carbon-based material layer, a metal layer and a titanium nitride layer.

It should be noted that materials of the first conductive layer 103, the second conductive layer 105, and the third conductive layer 107 may be heavily doped polysilicon, a carbon-based material, or various metals such as aluminum, tungsten and copper, and may also be a low resistivity compound such as titanium nitride or a combination of the above several conductive materials.

Optionally, in the embodiment of the present application, a projected area of the first insulating layer 102 on the semiconductor substrate 101 is the same as that of the first conductive layer 103, the projected area of the first insulating layer 102 on the semiconductor substrate 101 is less than that of the second insulating layer 104, and the projected area of the second insulating layer 104 on the semiconductor substrate 101 is less than that of the second conductive layer 105.

In other words, the second insulating layer 104 covers the first insulating layer 102 and the first conductive layer 103, thereby achieving the purpose of electrically isolating the first conductive layer 103 from the second conductive layer 105. The second conductive layer 105 covers the second insulating layer 104, thereby achieving electrical connection between the second conductive layer 105 and the semiconductor substrate 101.

Optionally, in the embodiment of the present application, a projected area of the third insulating layer 106 on the semiconductor substrate 101 is greater than that of the third conductive layer 107.

Figure 2:
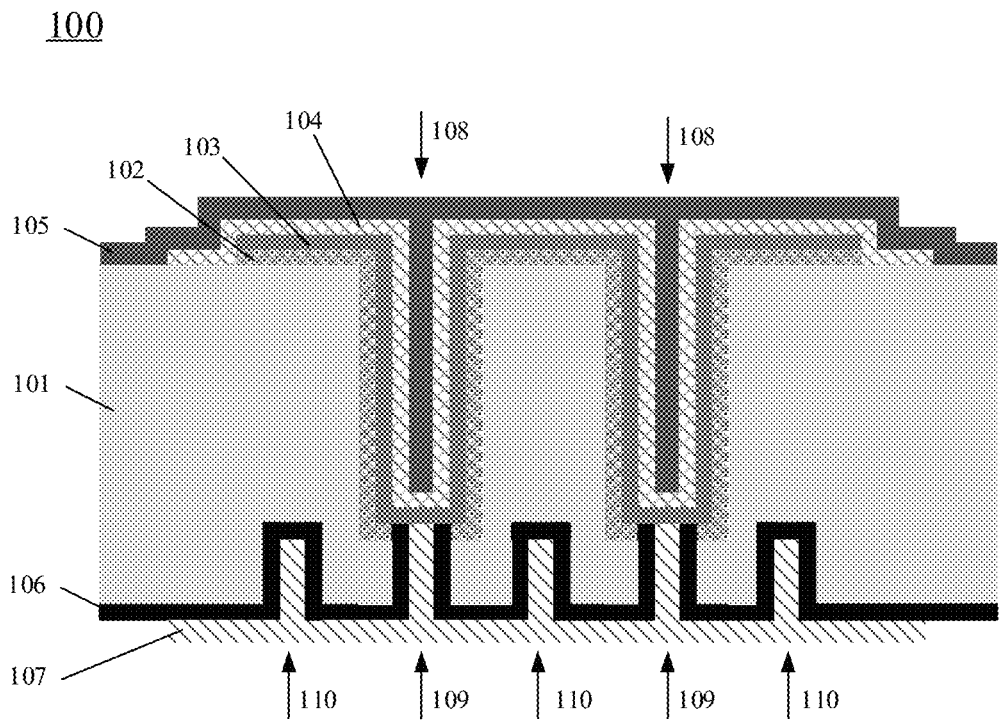
FIG. 2 is a schematic structural diagram of another capacitor according to an embodiment of the present application.

Optionally, as an embodiment, as shown in FIG. 2, in the capacitor 100 described in the embodiment of the present application, at least one third trench 110 is disposed in the semiconductor substrate 101.

Specifically, the third trench 110 is upward from the lower surface of the semiconductor substrate 101, a depth of the third trench 110 is less than a thickness of the semiconductor substrate 101, and the third conductive layer 107 is also disposed in the at least one third trench 110, that is, the third conductive layer 107 is deposited or implanted into the second trench 109 and the third trench 110. The third insulating layer 106 is disposed between the third conductive layer 107 and the semiconductor substrate 101, that is, the third insulating layer is also formed in the third trench 110 to isolate the semiconductor substrate from the three conductive layer.

Preferably, any cross section of the third trench 110 parallel to the surfaces of the semiconductor substrate 101 in the semiconductor substrate 101 has the same shape as a cross section of the second trench 109.

Preferably, a depth of the third trench 110 is equal to that of the second trench 109.

In other words, the third trench 110 and the second trench 109 may be substantially identical trenches formed in the semiconductor substrate, both are provided with the third insulating layer and the third conductive layer therein, and only differ in that a connection with the second conductive layer is not generated at the location of the third trench.

It should be noted that FIG. 2 is only described by an example where the third trench 110 has the same cross section in the semiconductor substrate 101 as the second trench 109, and the third trench 110 has a depth equal to the second trench, but does not limit the specific implementation of the third trench 110 in this embodiment.

It should be noted that a size of the cross section of the third trench 110 is not limited in the embodiment. For example, the third trench 110 may be a hole with a small difference between length and width of the cross section (which may be referred to as a deep hole), or a trench with a large difference between length and width.

A pattern of the cross section of the third trench 110 in the semiconductor substrate 101 may refer to related description of the first trench 108 and the second trench 109, and details are not described herein again.

In a specific implementation, an extending direction of the third trench 110 may be the same with or different from the extending directions of the first trench 108 and the second trench 109, as long as the third trench 110 is ensured not to be in communication with the first trench 108 and the second trench 109. For example, one of the trenches may be perpendicular to the surfaces of the semiconductor substrate and other trenches may have an oblique angle with respect to the trench. Similarly, extending directions of different third trenches 110 may be the same or different.

It should be noted that, in a specific implementation, as shown in FIG. 2, in the capacitor 100, two first trenches 108, two second trenches 109, and three third trenches 110 are disposed. The semiconductor substrate 101, the first insulating layer 102 and the first conductive layer 103 may constitute a capacitor D (capacitance C4), the first conductive layer 103, the second insulating layer 104 and the second conductive layer 105 may constitute a capacitor E (capacitance C5), and the third conductive layer 107, the third insulating layer 106 and the semiconductor substrate 101 may constitute a capacitor F (capacitance C6). The capacitor D, the capacitor E and the capacitor F are connected in parallel, and capacitance C of the capacitor 100 may be equivalent capacitance of the capacitor D, the capacitor E and the capacitor F in parallel, that is, C=C4+C5+C6. Compared to the capacitor shown in FIG. 1, the number of capacitors included in the capacitor 100 remains unchanged, but due to an increased opposing area of two electrode plates of each of the capacitors (capacitor D, capacitor E and capacitor F), C4, C5 and C6 are all increased, and at this time, the equivalent capacitance C is increased as well. In other words, the total capacitance value of the capacitor 100 is increased.

Therefore, in the embodiment, the total capacitance value could be further increased by providing a third trench in a semiconductor substrate to increase the opposing area between the semiconductor substrate 101 and the third conductive layer 107.

Figure 3:
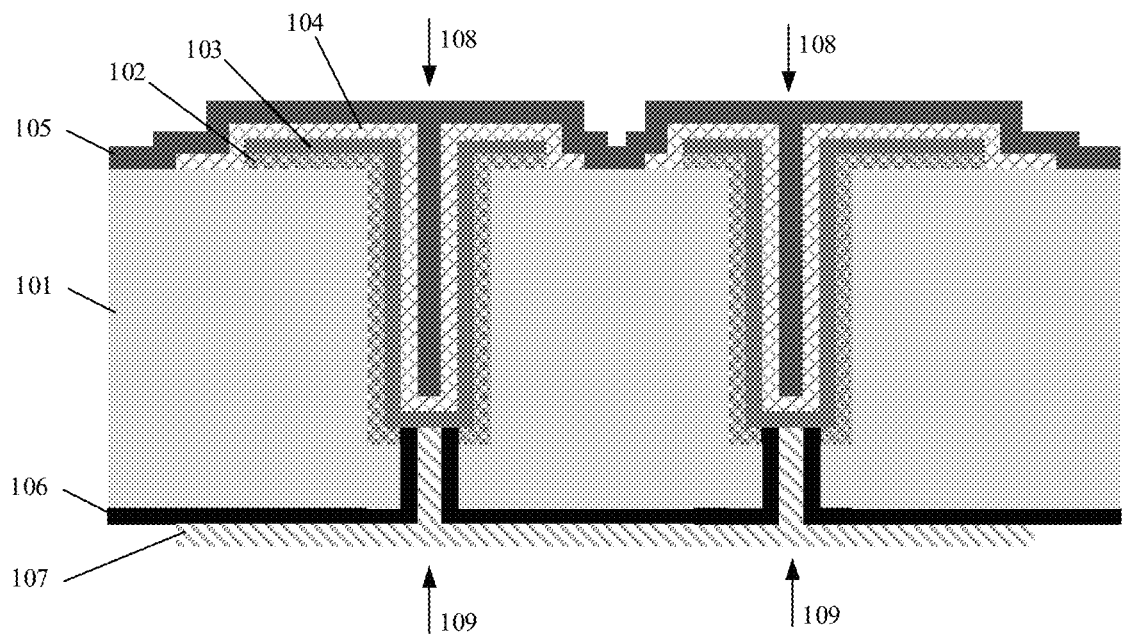
FIG. 3 is a schematic structural diagram of another capacitor according to an embodiment of the present application.

Optionally, as an embodiment, as shown in FIG. 3, in the capacitor 100 of the embodiment of the present application, on the upper surface of the semiconductor substrate 101, the second conductive layer 105 forms a downward recess between two adjacent first trenches 108 to block the second insulating layer 104 and be electrically connected to the semiconductor substrate 101.

In a specific implementation, as shown in FIG. 3, in the capacitor 100, two first trenches 108 and two second trenches 109 are disposed. For example, the two first trenches 108 may be a first trench M and a first trench N (corresponding to a first trench 108 on the left side and a first trench 108 on the right side in FIG. 3, respectively), and the two second trenches 109 may be a second trench X and a second trench Y (corresponding to a second trench 109 on the left side and a second trench 109 on the right side in FIG. 3, respectively). For the first trench M and the second trench X corresponding thereto, the semiconductor substrate 101, the first insulating layer 102 and the first conductive layer 103 may constitute a capacitor O (capacitance C7), the first conductive layer 103, the second insulating layer 104 and the second conductive layer 105 may constitute a capacitor P (capacitance C8), and the third conductive layer 107, the third insulating layer 106, and the semiconductor substrate 101 may constitute a capacitor Q (capacitance C9). For the first trench N and the second trench Y corresponding thereto, the semiconductor substrate 101, the first insulating layer 102 and the first conductive layer 103 may constitute a capacitor R (capacitance C10), the first conductive layer 103, the second insulating layer 104 and the second conductive layer 105 may constitute a capacitor S (capacitance C11), and the third conductive layer 107, the third insulating layer 106, and the semiconductor substrate 101 may also constitute a capacitor Q (capacitance C9). The capacitor O, the capacitor P, the capacitor Q, the capacitor R and the capacitor S are connected in parallel, and capacitance C of the capacitor 100 may be equivalent capacitance of the capacitor O, the capacitor P, the capacitor Q, the capacitor R and the capacitor S in parallel, that is, C=C7+C8+C9+C10+C11.

It should be noted that, a contact point between a second conductive layer and a semiconductor substrate is added between two adjacent first trenches, which is beneficial to reduce equivalent series resistance (Equivalent Series Resistance, ESR) of a capacitor and optimizing capacitor performance.

Figure 4:
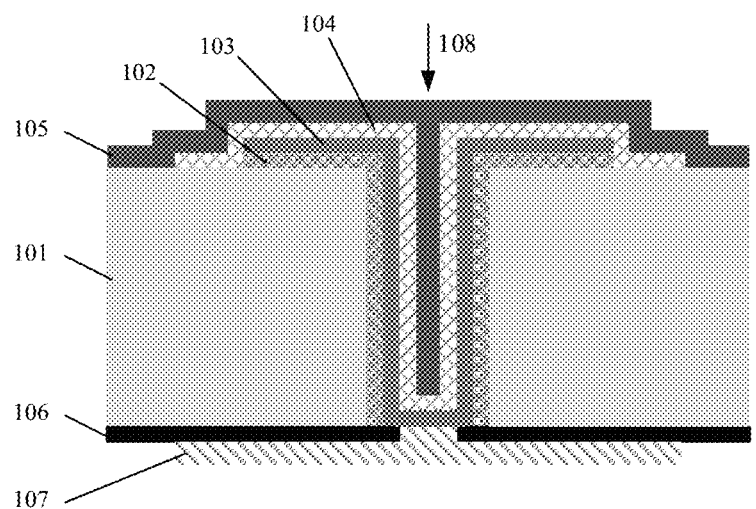
FIG. 4 is a schematic structural diagram of yet another capacitor according to an embodiment of the present application.

Optionally, as an embodiment, as shown in FIG. 4, in the capacitor 100 of the embodiment of the present application, a depth of the first trench 108 is substantially equal to a thickness of the semiconductor substrate 101, and a depth of the second trench 109 is substantially equal to zero.

Specifically, as shown in FIG. 4, at this time, the semiconductor substrate 101 is only required to be provided with the first trench 108, and there is no need to provide the second trench 109, but before forming the third conductive layer, an opening is required to be formed at a position of the third insulating layer corresponding to the first trench such that the third conductive layer is electrically connected to the first conductive layer. The opening formed here has a basic function similar to the second trench.

It should be noted that, in the embodiment, at least one third trench 110 may be disposed.

Therefore, in the embodiment, only a first trench needs to be etched, which simplifies a fabrication process of a capacitor.

Hereinafter, a method for fabricating a capacitor according to an embodiment of the present application will be introduced in detail with reference to FIGS. 5 to 9. It should be understood that FIGS. 5 to 9 are schematic flow charts of a method for fabricating a capacitor according to an embodiment of the present application, but these steps or operations are merely examples, and other operations or variations of various operations in FIGS. 5 to 9 may also be performed in the embodiment of the present application.

Figure 5:
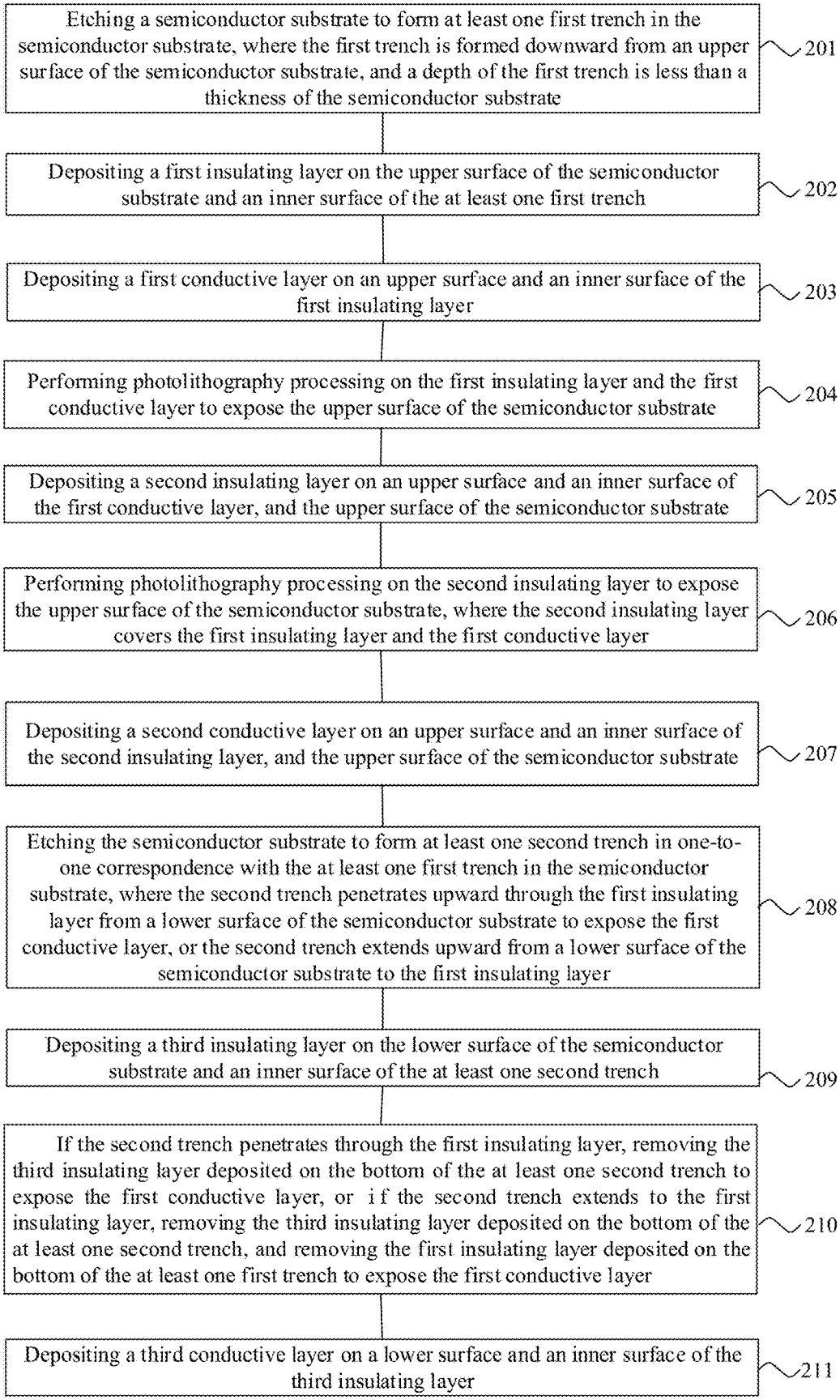
FIG. 5 is a schematic flow chart of a method for fabricating a capacitor according to an embodiment of the present application.

FIG. 5 illustrates a schematic flow chart of a method 200 for fabricating a capacitor according to an embodiment of the present application. As shown in FIG. 5, the method 200 for fabricating the capacitor includes the following steps.

Step 201, a semiconductor substrate 101 is etched to form at least one first trench 108 in the semiconductor substrate 101, where the first trench 108 is downward from an upper surface of the semiconductor substrate 101, and a depth of the first trench 108 is less than a thickness of the semiconductor substrate 101.

Optionally, the semiconductor substrate may be etched according to deep reactive ion etching to form the at least one first trench in the semiconductor substrate.

Figure 6A:
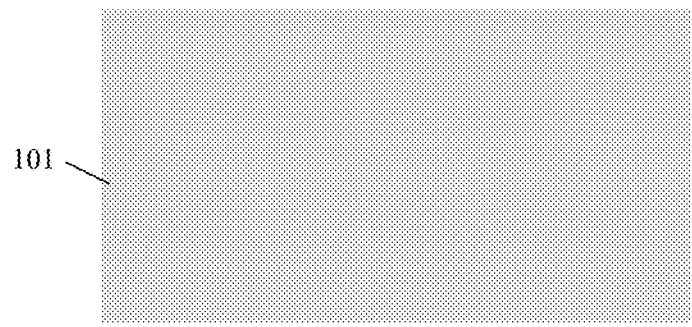
FIGS. 6a to 6x are schematic diagrams of a method for fabricating a capacitor according to an embodiment of the present application.
Figure 6B:
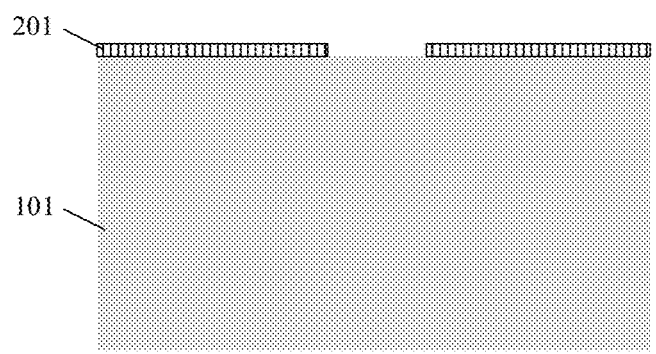
Figure 6C:
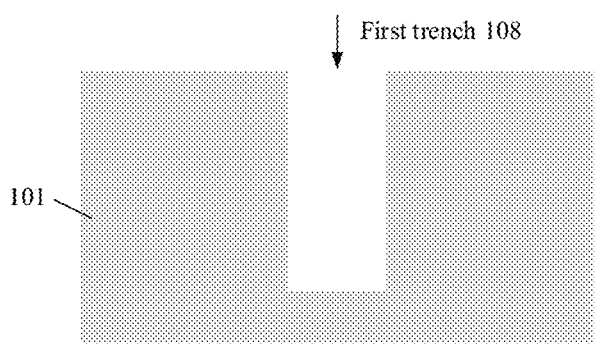

Specifically, first, a layer of photoresist 201 is spin-coated on an upper surface (front side) of a semiconductor substrate 101 as shown in FIG. 6a, and after exposure and development, an etched pattern window not covered with the photoresist is formed, as shown in FIG. 6b. Next, at least one first trench structure 108 is fabricated in the semiconductor substrate 101 by deep reactive ion etching. The first trench 108 extends downward from the upper surface of the semiconductor substrate 101, and a depth of the first trench 108 is less than a thickness of the semiconductor substrate 101, as shown in FIG. 6c.

It should be understood that after etching the at least one first trench 108, the photoresist 201 is removed.

Step 202, a first insulating layer 102 is deposited on the upper surface of the semiconductor substrate 101 and an inner surface of the at least one first trench 108.

Figure 6D:
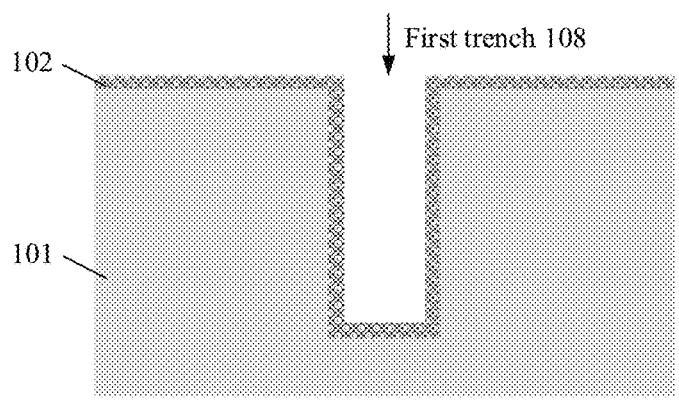

Specifically, an insulating material is deposited in the at least one first trench to form a first insulating layer 102, as shown in FIG. 6d.

For example, silicon dioxide is deposited (grown) as the first insulating layer on the upper surface of the semiconductor substrate and the inner surface of the at least one first trench by means of thermal oxidation. For another example, a silicon nitride or a silicon oxide, such as silicon dioxide converted by undoped silicon glass (USG) or tetraethyl orthosilicate (TEOS), is grown by means of physical vapor deposition (PVD) or chemical vapor deposition (CVD), and used as the first insulating layer. For another example, various types of polymers, such as polyimide, parylene, benzocyclobutene (BCB), or the like, are sprayed or spin-coated and used as the first insulating layer; or the first insulating layer may also be spin on glass (SOG), that is, amorphous phase silicon oxide obtained by spin-coating or spraying a silicide-containing solution on a silicon wafer, then performing heating to remove a solvent, and conducting curing. In view of processing effect and cost, silicon dioxide may be selectively grown as the first insulating layer by means of thermal oxidation.

It should be noted that a material of the first insulating layer 102 includes a silicon oxide, a silicon nitride, a metal oxide, a metal nitride, or the like, such as silicon dioxide, silicon nitride, aluminum oxide, aluminum nitride, hafnium oxide, zirconium oxide, zinc oxide, titanium dioxide, lead zirconate titanate, or the like. The first insulating layer may be single-layered, or two or multi-layered. A specific material and a layer thickness may be adjusted according to a capacitance value, a frequency characteristic, a loss and other requirements of a capacitor.

Step 203, a first conductive layer 103 is deposited on an upper surface and an inner surface of the first insulating layer 102.

Figure 6E:
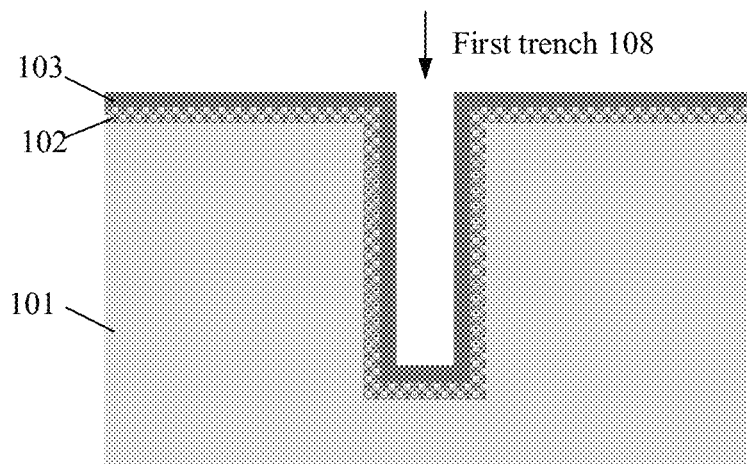

Specifically, in a structure shown in FIG. 6d, a conductive material is deposited on an upper surface and an inner surface of the first insulating layer 102 to form a first conductive layer 103, as shown in FIG. 6e.

It should be noted that, the method of depositing the first conductive layer 103 includes ALD, PVD, metal-organic chemical vapor deposition, evaporation, electroplating, or the like. A conductive material of the first conductive layer may be heavily doped polysilicon, a carbon-based material, or various metals such as aluminum, tungsten and copper, and may also be a low resistivity compound such as titanium nitride, or a combination of the above several conductive materials. The first conductive layer includes at least one of: a heavily doped polysilicon layer, a carbon-based material layer, a metal layer, and a titanium nitride layer.

Step 204, photolithography processing is performed on the first insulating layer 102 and the first conductive layer 103 to expose the upper surface of the semiconductor substrate 101.

Figure 6F:
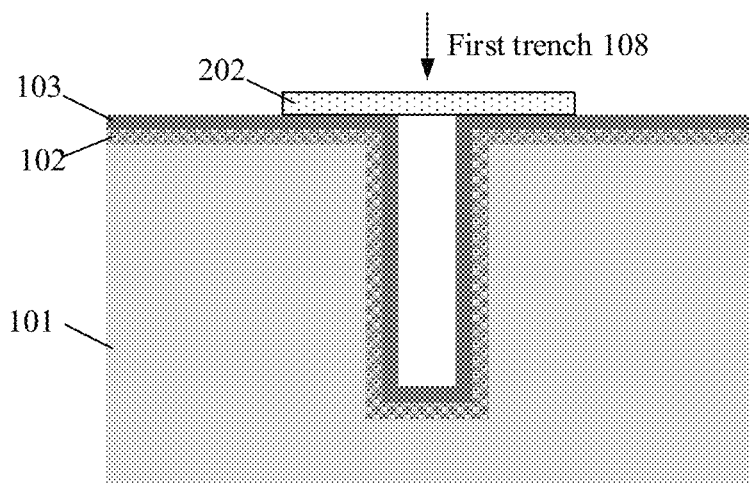
Figure 6G:
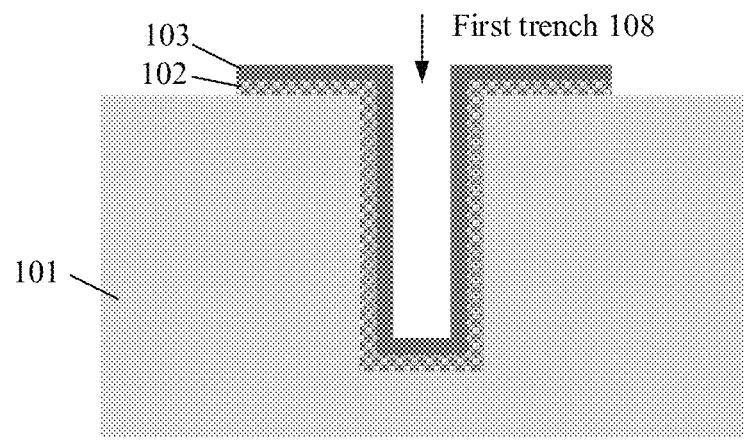

Specifically, first, an upper surface of a structure shown in FIG. 6e is covered with a photosensitive dry film 202, and after exposure and development, a dry film protection layer covering the first insulating layer 102, the first conductive layer 103 and their edges is formed, as shown in FIG. 6f. Next, the first insulating layer 102 and the first conductive layer 103 not covered with the photosensitive dry film 202 are removed by dry etching. Finally, the photosensitive dry film 202 is removed to obtain a pattern of a first insulating layer 102 and a first conductive layer 103 as shown in FIG. 6g. In this step, the pattern of the first insulating layer 102 and the first conductive layer 103 required remains, and excess portions of the first insulating layer 102 and the first conductive layer 103 are removed to expose the upper surface of the semiconductor substrate 101. It should be understood that the pattern shape of the first insulating layer 102 and the first conductive layer 103 remained may be designed according to capacitor specification requirements, and description will not be elaborated here.

Step 205, a second insulating layer 104 is deposited on an upper surface and an inner surface of the first conductive layer 103, and the upper surface of the semiconductor substrate 101.

Figure 6H:
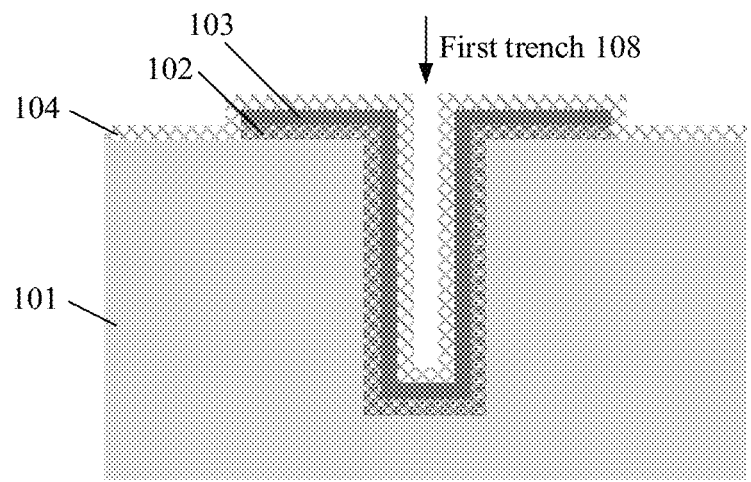

Specifically, in a structure shown in FIG. 6g, an insulating material is deposited on an upper surface and an inner surface of the first conductive layer 103, and the upper surface of the semiconductor substrate 101 to form a second insulating layer 104, as shown in FIG. 6h.

It should be noted that, the second insulating layer 104 may refer to the related description of the first insulating layer 102. For brevity, details are not described herein again.

Step 206, photolithography processing is performed on the second insulating layer 104 to expose the upper surface of the semiconductor substrate 101, where the second insulating layer 104 covers the first insulating layer 102 and the first conductive layer 103.

Figure 6I:
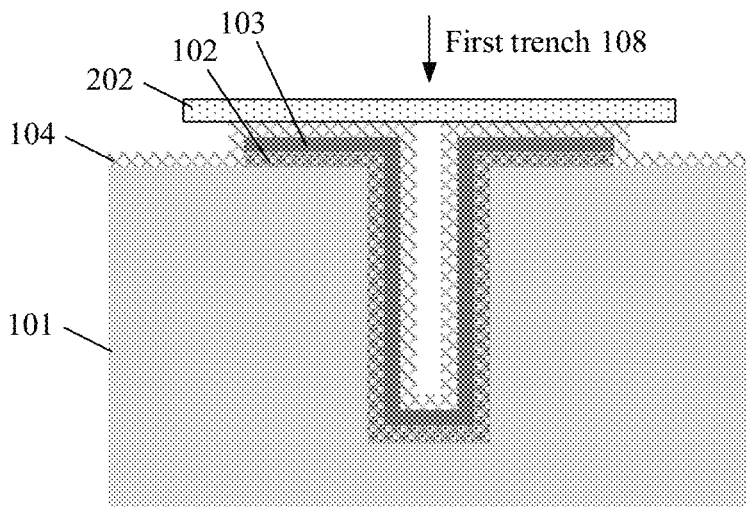
Figure 6J:
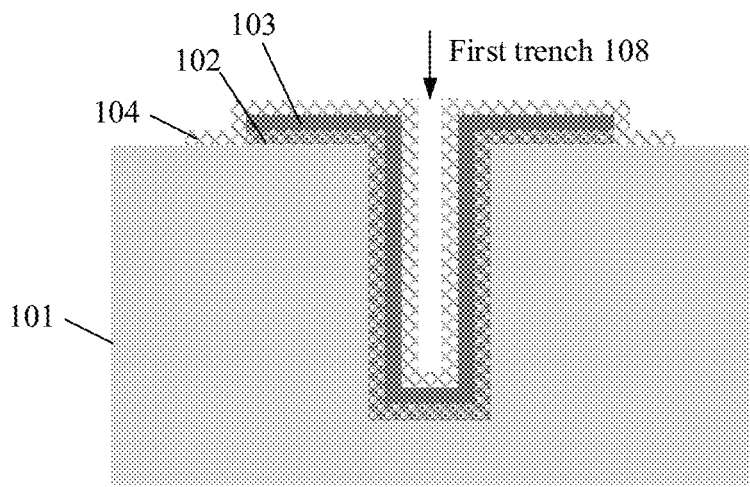

Specifically, first, an upper surface of a structure shown in FIG. 6h is covered with a photosensitive dry film 202, and after exposure and development, a dry film protection layer covering the second insulating layer 104 is formed, as shown in FIG. 6i. Next, the second insulating layer 104 not covered with the photosensitive dry film is removed by dry etching. Finally, the photosensitive dry film 202 is removed to obtain a pattern of the second insulating layer 104 as shown in FIG. 6j. Similarly, the second insulating layer 104 in this step remains in a predetermined pattern region, and an excess portion of the second insulating layer 104 is removed to expose the semiconductor substrate 101 corresponding to the portion. The second insulating layer 104 completely covers the first conductive layer 103.

Step 207, a second conductive layer 105 is deposited on an upper surface and an inner surface of the second insulating layer 104, and the upper surface of the semiconductor substrate 101.

Figure 6K:
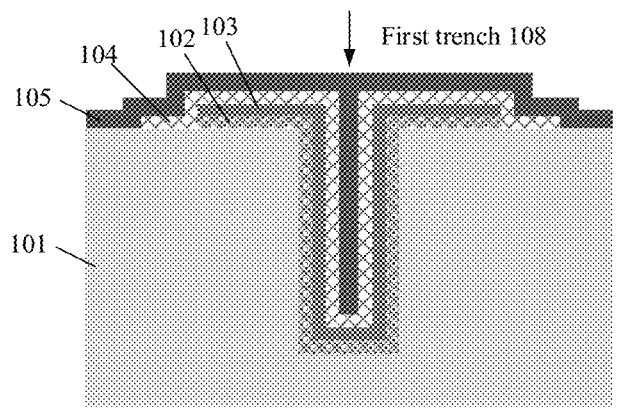

Specifically, in a structure shown in FIG. 6j, a conductive material is deposited on an upper surface and an inner surface of the second insulating layer 104, and the upper surface of the semiconductor substrate 101 to form a second conductive layer 105, as shown in FIG. 6k.

It should be noted that the second conductive layer 105 may refer to the related description of the first conductive layer 103. For brevity, details are not described herein again.

Step 208, the semiconductor substrate 101 is etched to form at least one second trench 109 in one-to-one correspondence with the at least one first trench 108 in the semiconductor substrate 101, where the second trench 109 penetrates upward through the first insulating layer 102 from a lower surface of the semiconductor substrate 101 to expose the first conductive layer 103, or the second trench 109 extends upward from a lower surface of the semiconductor substrate 101 to the first insulating layer 102.

Optionally, the semiconductor substrate 101 may be etched according to deep reactive ion etching to form the at least one second trench 109 in the semiconductor substrate 101.

It should be understood that an upper surface of each material layer in steps 202-208 refers to a surface of the material layer substantially parallel to the upper surface of the semiconductor substrate, and an inner surface of each material layer refers to an upper surface of the material layer in the trench. The upper surface and the inner surface may be regarded as a whole.

Figure 6L:
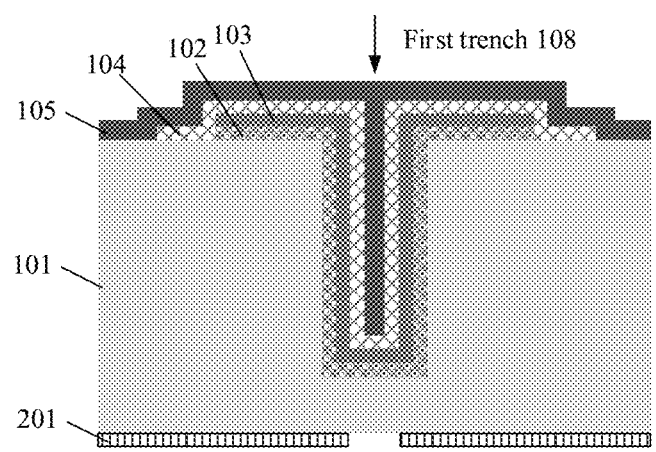
Figure 6M:
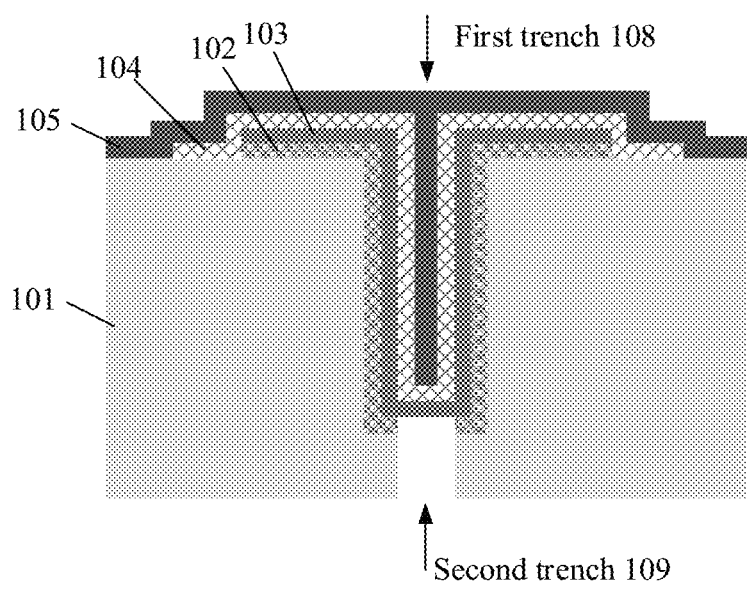
Figure 6N:
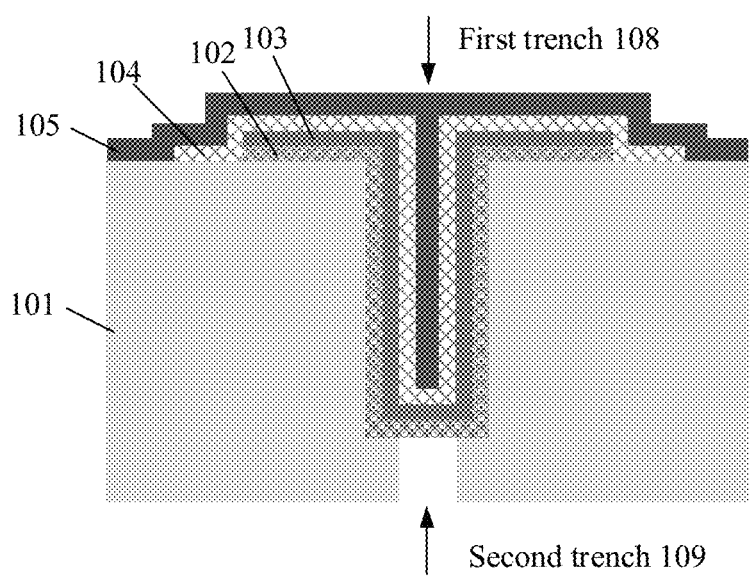

Specifically, first, a layer of photoresist 201 is spin-coated on a lower surface (back side) of a structure as shown in FIG. 6k, and after exposure and development, an etched pattern window not covered with the photoresist 201 is formed, as shown in FIG. 6l. Next, at least one second trench structure 109 is fabricated in the semiconductor substrate 101 by deep reactive ion etching. Optionally, in Manner I, the second trench 109 penetrates upward through the first insulating layer 102 from a lower surface of the semiconductor substrate 101 to expose the first conductive layer 103, as shown in FIG. 6m. In Manner II, the second trench 109 extends upward from a lower surface of the semiconductor substrate 101 to the first insulating layer 102, that is, only to the surface of the first insulating layer 102, as shown in FIG. 6n.

It should be understood that after etching the at least one second trench 109, the photoresist 201 is removed.

Step 209, a third insulating layer 106 is deposited on the lower surface of the semiconductor substrate 101 and an inner surface of the at least one second trench 109.

Figure 6O:
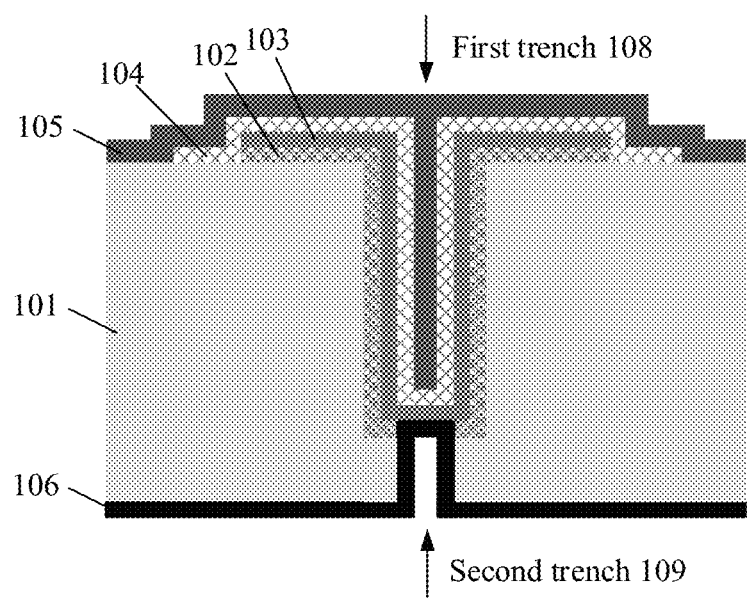

Specifically, if the second trench 109 is formed in Manner I in step 208, in a structure shown in FIG. 6m, an insulating material is deposited on the lower surface of the semiconductor substrate 101 and an inner surface of the at least one second trench 109 to form a third insulating layer 106, as shown in FIG. 6o.

Figure 6P:
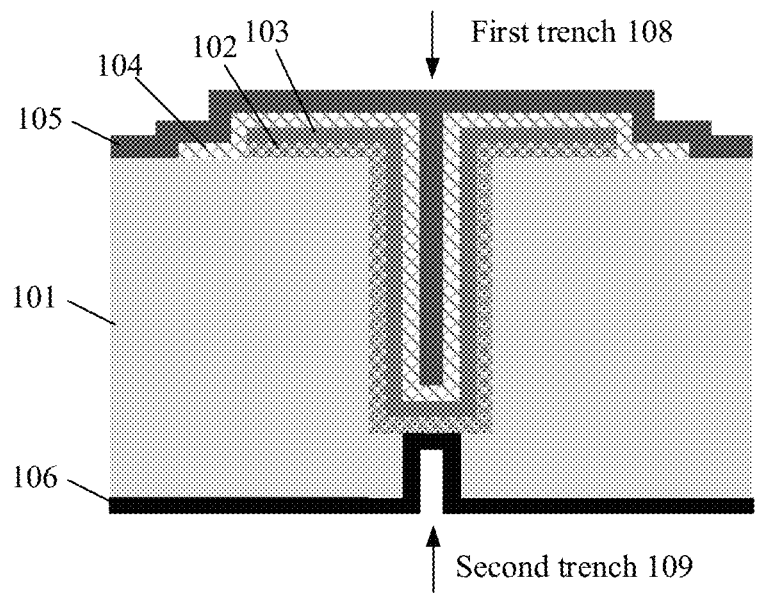

If the second trench 109 is formed in Manner II in step 208, in a structure shown in FIG. 6n, an insulating material is deposited on the lower surface of the semiconductor substrate 101 and an inner surface of the at least one second trench 109 to form a third insulating layer 106, as shown in FIG. 6p.

It should be noted that the third insulating layer 106 may refer to the related description of the first insulating layer 102. For brevity, details are not described herein again.

Step 210, if the second trench 109 penetrates through the first insulating layer 102 (Manner I in step 208), the third insulating layer 106 deposited on the bottom of the at least one second trench 109 is removed to expose the first conductive layer 103, or, if the second trench 109 extends to the first insulating layer 102 (Manner II in step 208), the third insulating layer 106 deposited on the bottom of the at least one second trench 109 is removed, and the first insulating layer 102 deposited on the bottom of the at least one first trench 108 is removed to expose the first conductive layer 103.

Figure 6Q:
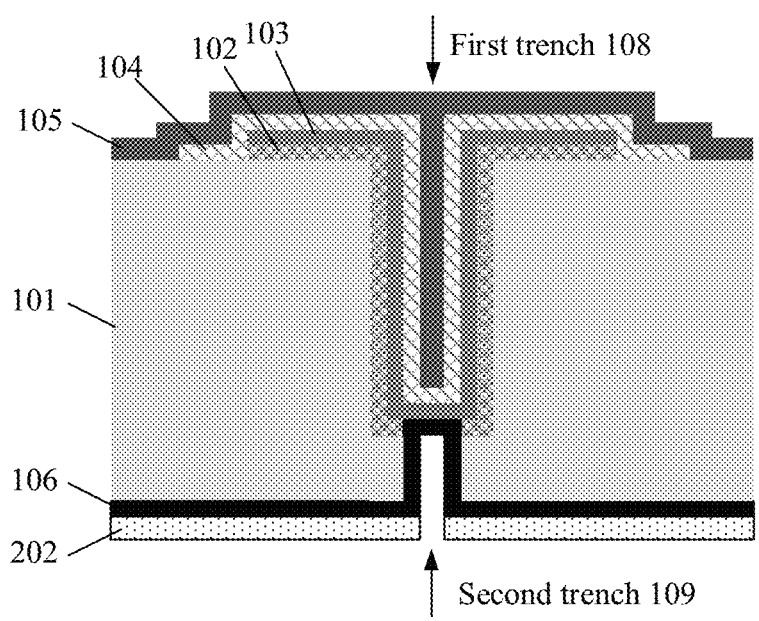

Specifically, if the second trench 109 is formed in Manner I in step 208, first, a lower surface of a structure shown in FIG. 6o is covered with a layer of photosensitive dry film 202, and after exposure and development, a dry film protection layer covering a lower surface of the third insulating layer 106 is formed, as shown in FIG. 6q. Next, the third insulating layer 106 deposited on the bottom of the at least one second trench 109 is removed by dry etching to expose the first conductive layer 103, as shown in FIG. 6r.

Figure 6R:
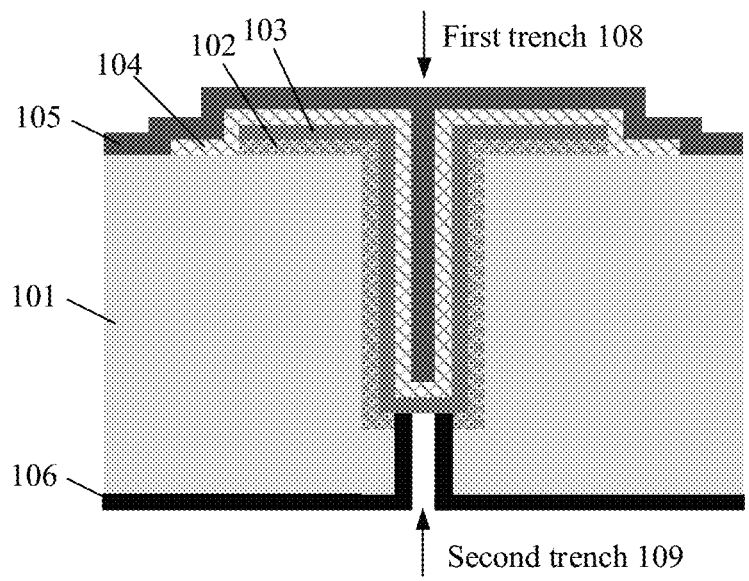
Figure 6S:
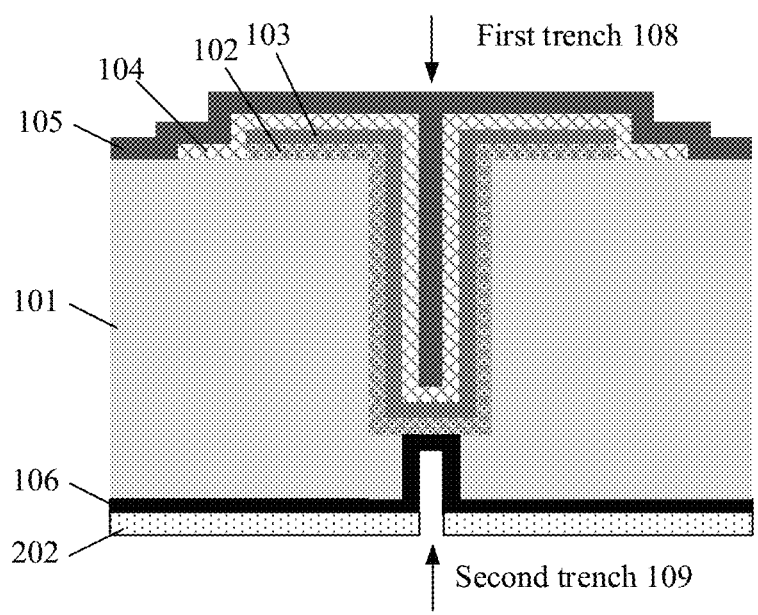

If the second trench 109 is formed in Manner II in step 208, first, a lower surface of a structure shown in FIG. 6p is covered with a layer of photosensitive dry film 202, and after exposure and development, a dry film protection layer covering a lower surface of the third insulating layer 106 is formed, as shown in FIG. 6s. Next, the third insulating layer 106 deposited on the bottom of the at least one second trench 109 and the first insulating layer 102 deposited on the bottom of the at least one first trench 108 are removed by dry etching to expose the first conductive layer 103, as shown in FIG. 6t.

Step 211, a third conductive layer 107 is deposited on a lower surface and an inner surface of the third insulating layer 106.

Figure 6T:
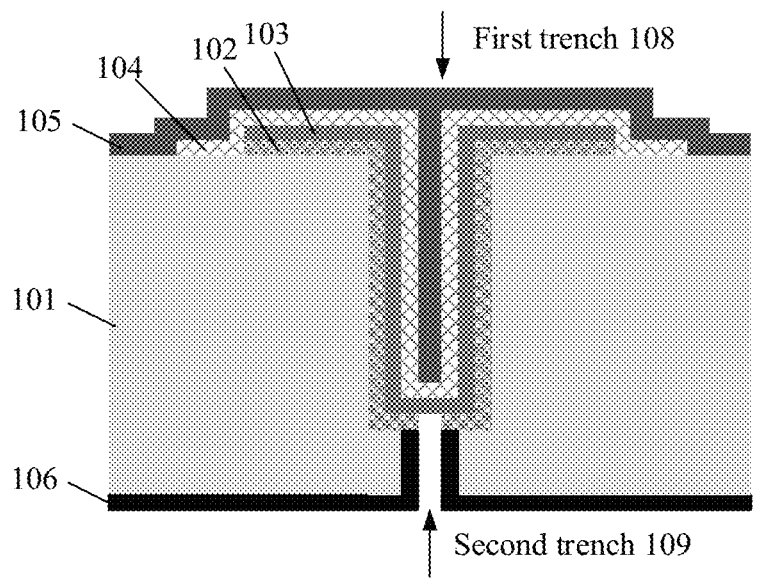
Figure 6U:
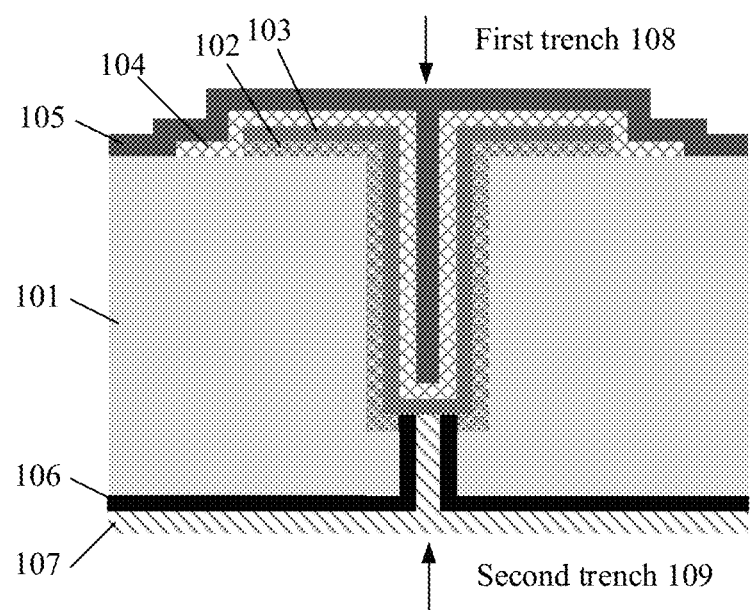

Specifically, if the second trench 109 is formed in Manner I in step 208, in a structure shown in FIG. 6r, a third conductive layer 107 is deposited on a lower surface and an inner surface of the third insulating layer 106, as shown in FIG. 6u.

Figure 6V:
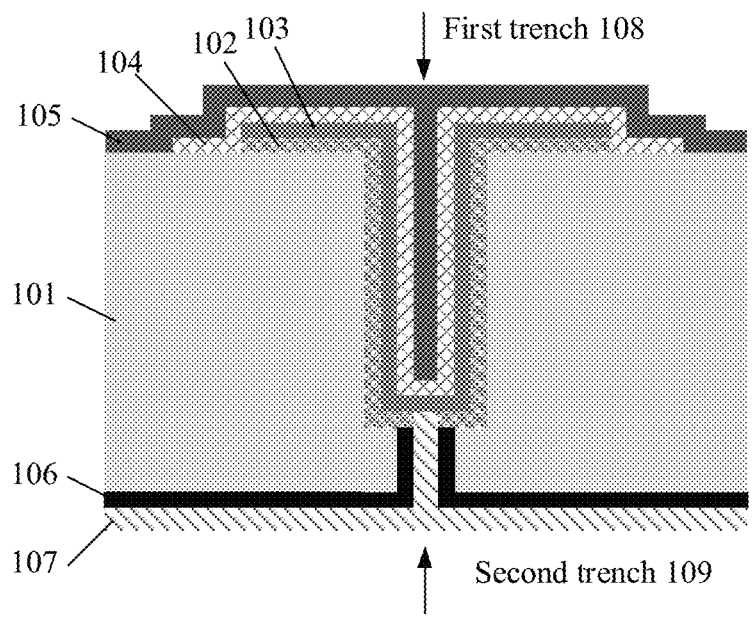

If the second trench 109 is formed in Manner II in step 208, in a structure shown in FIG. 6t, a third conductive layer 107 is deposited on a lower surface and an inner surface of the third insulating layer 106, as shown in FIG. 6v.

It should be noted that the third conductive layer 107 may refer to the related description of the first conductive layer 103. For brevity, details are not described herein again.

Optionally, before etching the semiconductor substrate 101 in step 208, the method 200 further includes: performing thinning processing on the lower surface of the semiconductor substrate 101.

Specifically, the lower surface of the semiconductor substrate 101 is first thinned to a suitable thickness by means of back grinding and polishing, and then etched to form the at least one second trench 109.

It should be noted that when the thickness of the semiconductor substrate 101 does not satisfy a requirement of a capacitor, thinning processing is performed on the lower surface of the semiconductor substrate 101. That is, when the sum of the depth of the first trench 108 and the depth of the second trench 109 is less than the thickness of the semiconductor substrate 101, thinning processing is required to be performed on the lower surface of the semiconductor substrate 101 so as to achieve communication between the bottom of the first trench 108 and the bottom of the second trench 109.

Optionally, the method 200 further includes:

performing photolithography processing on the third conductive layer 107 to expose the lower surface of the semiconductor substrate 101.

That is, after step 211, photolithography processing is further required to be performed on the third conductive layer 107 to expose the lower surface of the semiconductor substrate 101.

Figure 6W:
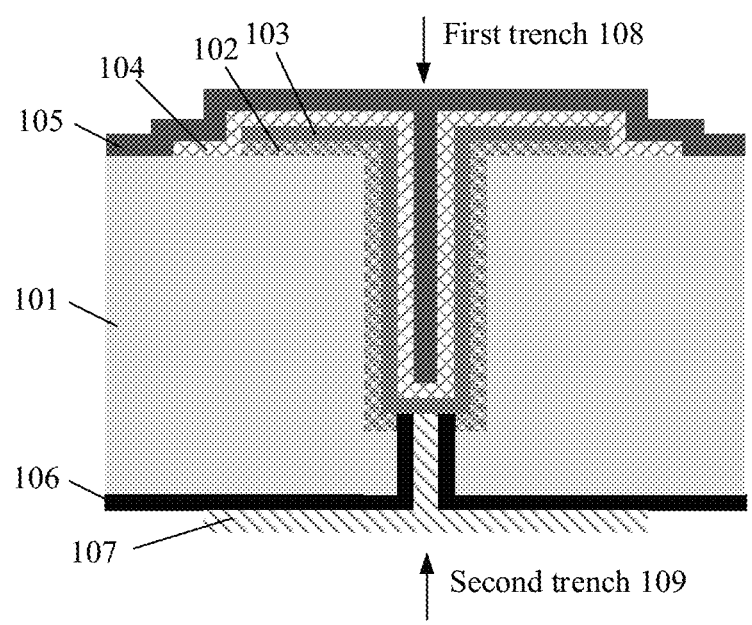
Figure 6X:
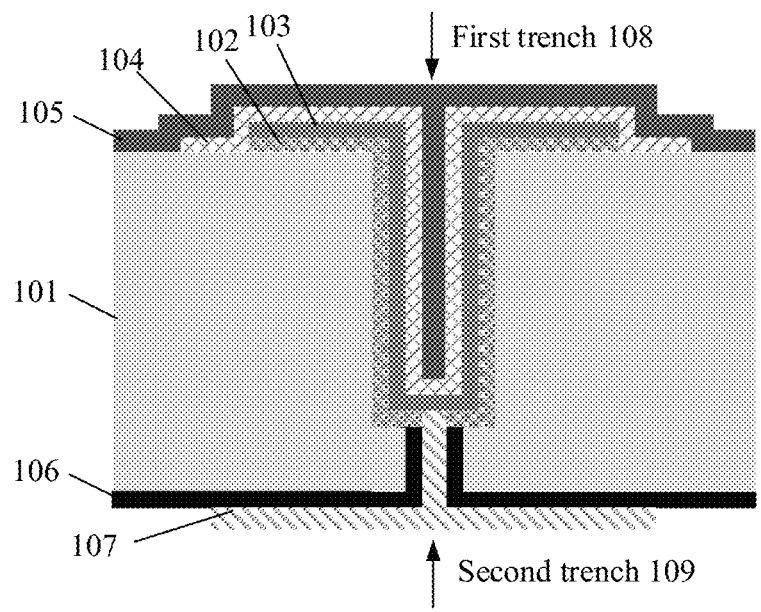

Specifically, first, a layer of photoresist 201 is spin-coated on a lower surface of a structure as shown in FIG. 6u or FIG. 6v, and after exposure and development, a photoresist pattern covering the third conductive layer 107 is formed. Next, a metal not covered with the photoresist 201 is removed with a copper etching solution and a titanium etching solution. Finally, the photoresist 201 is removed to obtain a capacitor as shown in FIG. 6w or FIG. 6x.

It should be understood that FIG. 6 (FIGS. 6a-6x) is exemplified by etching one first trench 108 and one second trench 109, and other numbers of first trenches 108 and second trenches 109 may also be etched, which is not limited by the embodiment of the present application.

In this step, a third conductive layer in a pattern region remains according to a pre-designed electrode pattern, and the third conductive layer in the rest region is removed to expose a surface of a semiconductor substrate, and the remained third conductive layer thus forms an electrode of the predetermined pattern, and serves as one electrode of a capacitor.

Optionally, the method 200 further includes:

etching the semiconductor substrate 101 to form at least one third trench 110 in the semiconductor substrate 101, where the third trench 110 extends upward from the lower surface of the semiconductor substrate 101, and a depth of the third trench 110 is less than the thickness of the semiconductor substrate 101; and depositing the third insulating layer 106 on an inner surface of the at least one third trench 110, and depositing the third conductive layer 107 on the inner surface of the third insulating layer 106.

Specifically, first, a layer of photoresist 201 is spin-coated on the lower surface (back side) of the semiconductor substrate 101, and after exposure and development, an etched pattern window not covered with the photoresist 201 is formed. Next, at least one third trench 110 is fabricated in the semiconductor substrate 101 by deep reactive ion etching.

Figure 7:
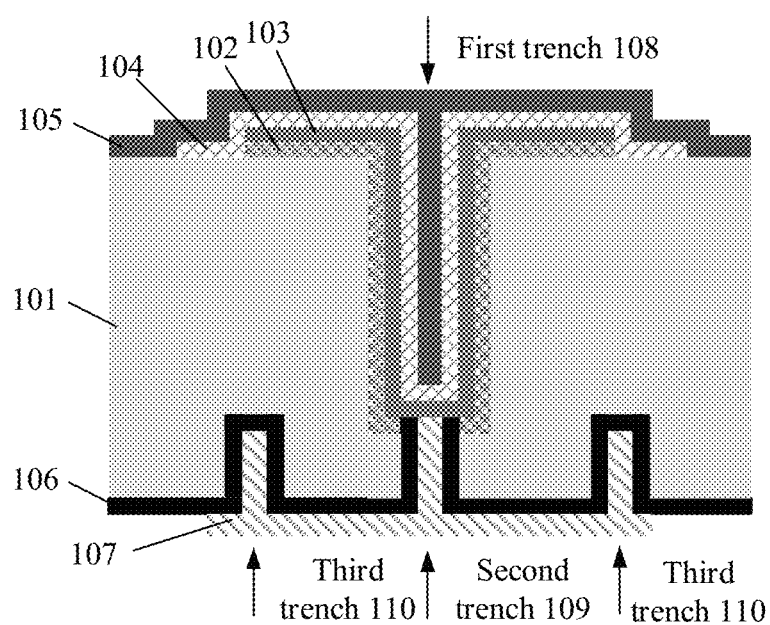
FIG. 7 is a schematic structural diagram of yet another capacitor according to an embodiment of the present application.
Figure 8:
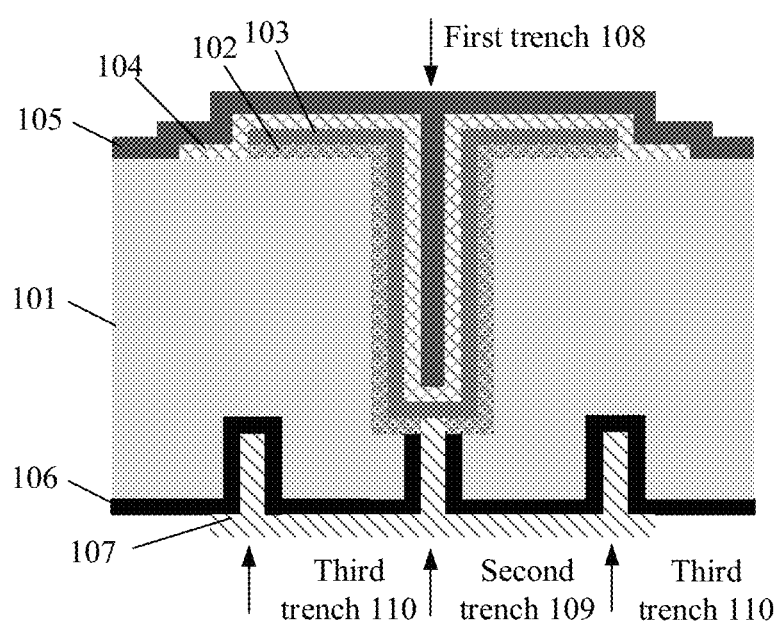
FIG. 8 is a schematic structural diagram of yet another capacitor according to an embodiment of the present application.

Optionally, a capacitor including a third trench 110 as shown in FIG. 7 may be fabricated, and a capacitor including a third trench 110 as shown in FIG. 8 may also be fabricated.

It should be understood that FIG. 7 and FIG. 8 are exemplified by etching one first trench, one second trench and two third trenches, and other numbers of first trenches, second trenches and third trenches may also be etched, which is not limited by the embodiment of the present application. The third trench and the second trench may be formed in the same process, that is, the two trenches and filling materials such as an insulating layer and a conductive layer in the trenches may be formed synchronously.

Figure 9:
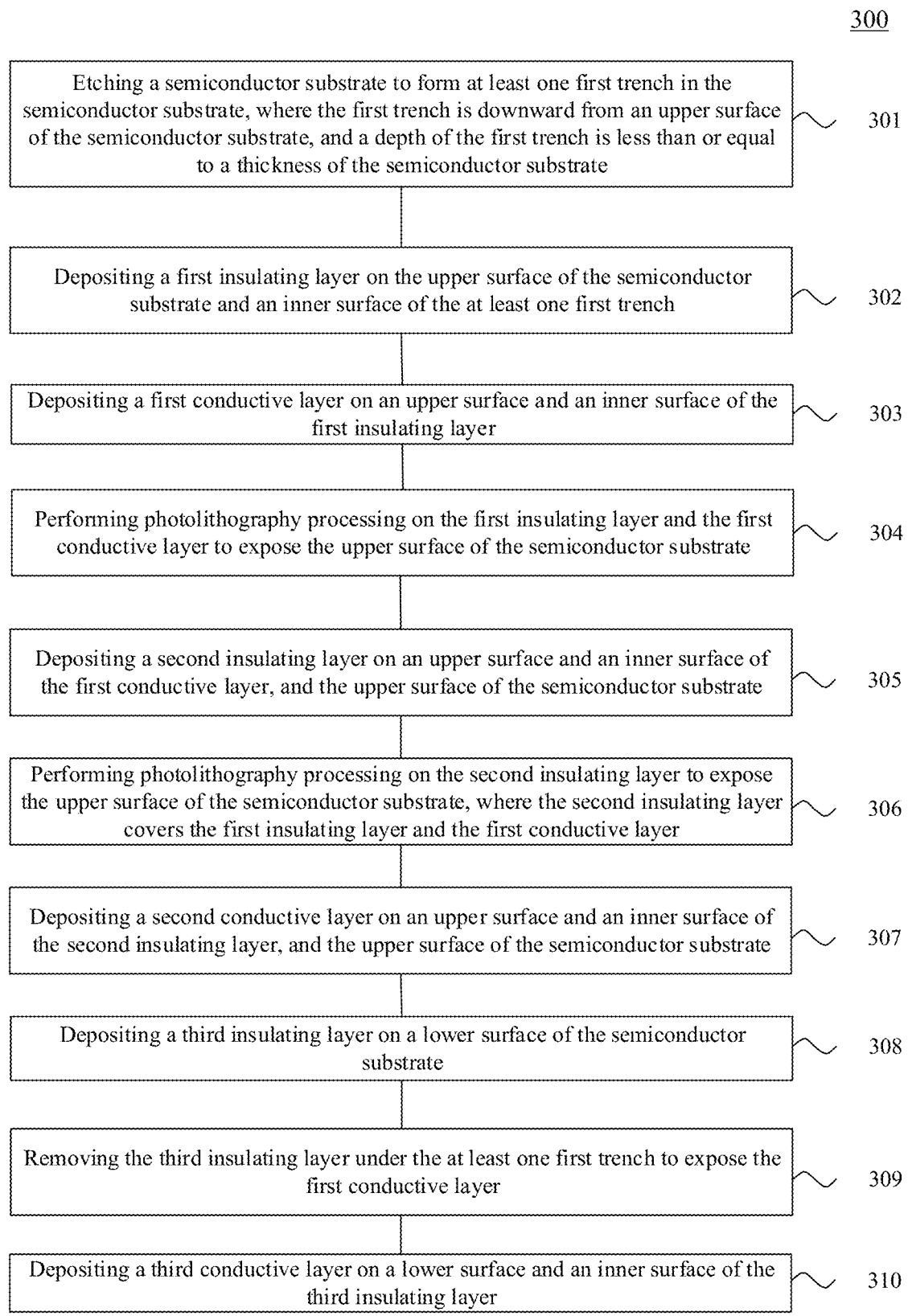
FIG. 9 is a schematic flow chart of another method for fabricating a capacitor according to an embodiment of the present application.

FIG. 9 illustrates a schematic flow chart of a method 300 for fabricating a capacitor according to an embodiment of the present application. As shown in FIG. 9, the method 300 for fabricating the capacitor includes:

step 301, etching a semiconductor substrate to form at least one first trench in the semiconductor substrate, where the first trench is downward from an upper surface of the semiconductor substrate, and a depth of the first trench is less than or equal to a thickness of the semiconductor substrate;

step 302, depositing a first insulating layer on the upper surface of the semiconductor substrate and an inner surface of the at least one first trench;

step 303, depositing a first conductive layer on an upper surface and an inner surface of the first insulating layer;

step 304, performing photolithography processing on the first insulating layer and the first conductive layer to expose the upper surface of the semiconductor substrate;

step 305, depositing a second insulating layer on an upper surface and an inner surface of the first conductive layer, and the upper surface of the semiconductor substrate;

step 306, performing photolithography processing on the second insulating layer to expose the upper surface of the semiconductor substrate, where the second insulating layer covers the first insulating layer and the first conductive layer;

step 307, depositing a second conductive layer on an upper surface and an inner surface of the second insulating layer, and the upper surface of the semiconductor substrate;

step 308, depositing a third insulating layer on a lower surface of the semiconductor substrate;

step 309, removing the third insulating layer under the at least one first trench to expose the first conductive layer; and step 310, depositing a third conductive layer on a lower surface and an inner surface of the third insulating layer.

Optionally, when the depth of the first trench is less than the thickness of the semiconductor substrate, the method 300 further includes:

performing thinning processing on the lower surface of the semiconductor substrate before depositing the third insulating layer on the lower surface of the semiconductor substrate (step 308).

Specifically, the lower surface of the semiconductor substrate is first thinned to a suitable thickness by means of back grinding and polishing, and then the third insulating layer is deposited on the lower surface of the semiconductor substrate.

Optionally, the method 300 further includes:

performing photolithography processing on the third conductive layer to expose the lower surface of the semiconductor substrate.

Specifically, compared with the method 200, the method 300 mainly differs in that a second trench is not formed on the lower surface of the semiconductor substrate, or the second trench has a depth of zero; and a third insulating layer is formed directly on a semiconductor substrate, and further a window or a hole is opened on the third insulating layer to form a third conductive layer (i.e., an electrode of a capacitor) electrically connected to a first conductive layer. Based on the method 300, a capacitor as shown in FIG. 4 may be fabricated.

It should be understood that steps in the method 300 for fabricating a capacitor may refer to the corresponding steps in the method 200 for fabricating a capacitor. For brevity, details are not described herein again.

Therefore, in the embodiment of the present application, by properly designing a pattern, a first prepared material film is covered and protected in a subsequent photolithography process, thereby reducing etching difficulty and improving process reliability.

A method for fabricating a capacitor according to the present application is further described below in conjunction with a specific embodiment. For ease of understanding, a capacitor as shown in FIG. 1 is fabricated in this embodiment. Of course, capacitors shown in FIG. 2, FIG. 3, FIG. 4, FIG. 6, FIG. 7, and FIG. 8 may also be fabricated by using the method for fabricating the capacitor in the embodiment, except that design of a trench, coverage area of an insulating layer and a conductive layer as well as other parts are slightly different. For the sake of brevity, details are not described herein again.

Step 1: A boron-doped silicon wafer with resistivity of 0.001-0.005 Ω·cm, a crystal orientation of (100), and a thickness of 750 µm is selected as a semiconductor substrate. A layer of photoresist is spin-coated on an upper surface (front side) of the semiconductor substrate, and after exposure and development, a circular hole of a photoresist is formed on the upper surface of the semiconductor substrate, and a diameter of the circular hole is 10 µm. A first trench having a depth of 120 µm is then processed by using a DRIE process. Finally, the photoresist is removed.

Step 2: By means of an ALD process, 20 nm thick hafnium oxide ($HfO_2$) is deposited on the upper surface of the semiconductor substrate and a surface of the first trench as a first insulating layer.

Step 3: By means of an ALD process, a 25 nm thick titanium nitride (TiN) is deposited on a surface of the first insulating layer (hafnium oxide layer) as a first conductive layer.

Step 4: The upper surface of the semiconductor substrate is covered with a photosensitive dry film, and after exposure and development, a dry film protection layer covering the first trench and its edges is formed. Next, hafnium oxide and titanium nitride not covered with the dry film are removed by dry etching. Finally, the dry film is removed to obtain a pattern of the first insulating layer and the first conductive layer.

It should be noted that the photosensitive dry film occupies a partial region of the upper surface of the semiconductor substrate, and after the hafnium oxide and the titanium nitride not covered with the dry film are removed by dry etching, the upper surface of the semiconductor substrate is exposed.

Step 5: By means of an ALD process, 20 nm thick hafnium oxide ($HfO_2$) is deposited on the upper surface of the semiconductor substrate and a surface of the first conductive layer as a second insulating layer.

Step 6: An upper surface of the second insulating layer is covered with a photosensitive dry film, and after exposure and development, a dry film protection layer covering the second insulating layer and its edges is formed. Next, hafnium oxide not covered with the dry film is removed by dry etching. Finally, the dry film is removed to obtain a pattern of the second insulating layer.

It should be noted that, the photosensitive dry film occupies a partial region of the second insulating layer, and after the hafnium oxide not covered with the dry film is removed by dry etching, the upper surface of the semiconductor substrate is exposed.

Step 7: A second conductive layer is deposited on the upper surface of the semiconductor substrate and the surface of the second insulating layer. A layer of titanium and a thinner layer of copper are first deposited as a barrier layer and a seed layer for electroplating by means of PVD, and then a thicker layer of copper is deposited by electroplating to obtain the second conductive layer.

Step 8: A thickness of the lower surface (back side) of the semiconductor substrate is thinned to 150 µm by means of back grinding and polishing.

Step 9: A layer of photoresist is spin-coated on the lower surface (back side) of the polished semiconductor substrate, and after exposure and development, a circular hole of a photoresist is formed on the lower surface of the semiconductor substrate, and a diameter of the circular hole is 5 µm. A second trench aligned with the first trench is then processed by using a DRIE process. Finally, the photoresist is removed. It should be noted that, a depth of the second trench penetrates through the first insulating layer on the bottom of the first trench to expose the first conductive layer.

Step 10: A 200 nm TEOS is deposited on the lower surface of the semiconductor substrate and a surface of the second trench as a third insulating layer by means of a plasma enhanced chemical vapor deposition (PECVD) process.

Step 11: The lower surface of the semiconductor substrate is covered with a layer of photosensitive dry film, and after exposure and development, an opening is formed at the position of the second trench. The TEOS on the bottom of the second trench is then removed by dry etching to expose the first conductive layer.

Step 12: A third conductive layer is deposited on the lower surface of the semiconductor substrate, the bottom of the second trench, and a surface of the third insulating layer. A layer of titanium and a thinner layer of copper are first deposited as a barrier layer and a seed layer for electroplating by means of PVD, and then a thicker layer of copper is deposited by electroplating to obtain the third conductive layer.

Step 13: A layer of photoresist is spin-coated on a surface of the third conductive layer, and after exposure and development, a photoresist pattern is formed. A metal not covered with the photoresist is removed with a copper etching solution and a titanium etching solution.

It should be noted that, the photoresist occupies a partial region of the third conductive layer, and after the metal not covered with the photoresist is removed by the copper etching solution and the titanium etching solution, a lower surface of the third insulating layer is exposed.

A person skilled in the art can understand that preferred embodiments of the present application are described in detail above with reference to the accompanying drawings. However, the present application is not limited to specific details in the foregoing embodiments. Within the technical concept of the present application, the technical solution of the present application may carry out a variety of simple variants, all of which are within the scope of protection of the present application.

In addition, it should be noted that each of specific technical features described in the above specific embodiments may be combined in any suitable manner without contradiction. In order to avoid unnecessary repetition, various possible combination manners will not be described separately in the present application.

In addition, any combination of various different embodiments of the present application may also be made as long as it does not contradict the idea of the present application, and should also be regarded as the content of the application.

What is claimed is:

1. A capacitor, comprising:
    a semiconductor substrate comprising an upper surface and a lower surface opposite to the upper surface;

at least one first trench disposed in the semiconductor substrate and formed downward from the upper surface;

at least one second trench disposed in the semiconductor substrate and corresponding to the first trench, and formed upward from the lower surface;

a first conductive layer disposed above the semiconductor substrate and in the first trench;

a first insulating layer disposed between the semiconductor substrate and the first conductive layer to isolate the first conductive layer from the semiconductor substrate;

a second conductive layer disposed on the semiconductor substrate and in the first trench, the second conductive layer being electrically connected to the semiconductor substrate;

a second insulating layer disposed between the second conductive layer and the first conductive layer to isolate the second conductive layer from the first conductive layer;

a third conductive layer disposed below the semiconductor substrate and in the second trench; and a third insulating layer disposed between the third conductive layer and the semiconductor substrate to isolate the third conductive layer from the semiconductor substrate, the third conductive layer being electrically connected to the first conductive layer.

2. The capacitor according to claim 1, wherein at least one third trench is disposed in the semiconductor substrate, the third trench is formed upward from the lower surface of the semiconductor substrate, a depth of the third trench is less than a thickness of the semiconductor substrate, and the third insulating layer and the third conductive layer are sequentially disposed in the at least one third trench.

3. The capacitor according to claim 2, wherein any cross section of the third trench parallel to the surfaces of the semiconductor substrate in the semiconductor substrate is the same as that of the second trench.

4. The capacitor according to claim 1, wherein the second conductive layer forms a downward recess between two adjacent first trenches to block the second insulating layer and be electrically connected to the semiconductor substrate; or the second conductive layer is evenly disposed between two adjacent first trenches, and is isolated from the semiconductor substrate by the second insulating layer.

5. The capacitor according to claim 1, wherein a width of any cross section of the first trench parallel to the surfaces of the semiconductor substrate in the semiconductor substrate is greater than that of the second trench.

6. The capacitor according to claim 1, wherein the first trench is aligned with the second trench.

7. The capacitor according to claim 1, wherein a depth of the first trench is greater than that of the second trench.

8. The capacitor according to claim 1, wherein a depth of the first trench is equal to a thickness of the semiconductor substrate, and a depth of the second trench is equal to zero.

9. The capacitor according to claim 1, wherein a projected area of the first insulating layer on the semiconductor substrate is the same as that of the first conductive layer, the projected area of the first insulating layer on the semiconductor substrate is less than that of the second insulating layer, and the projected area of the second insulating layer on the semiconductor substrate is less than that of the second conductive layer.

10. The capacitor according to claim 1, wherein a projected area of the third insulating layer on the semiconductor substrate is greater than that of the third conductive layer.

11. The capacitor according to claim 1, wherein at least one of the first insulating layer, the second insulating layer and the third insulating layer comprises at least one of:
a silicon oxide layer, a silicon nitride layer, a metal oxide layer, and a metal nitride layer.

12. The capacitor according to claim 1, wherein at least one of the first conductive layer, the second conductive layer and the third conductive layer comprises at least one of a heavily doped polysilicon layer, a carbon-based material layer, a metal layer, and a titanium nitride layer.

13. The capacitor according to claim 1, wherein the second conductive layer is one electrode of the capacitor, and the third conductive layer is the other electrode of the capacitor.

14. A method for fabricating a capacitor, comprising:
etching a semiconductor substrate to form at least one first trench in the semiconductor substrate, wherein the first trench is formed downward from an upper surface of the semiconductor substrate, and a depth of the first trench is less than a thickness of the semiconductor substrate;

depositing a first insulating layer on the upper surface of the semiconductor substrate and an inner surface of the at least one first trench;

depositing a first conductive layer on an upper surface and an inner surface of the first insulating layer;

performing photolithography processing on the first insulating layer and the first conductive layer to expose the upper surface of the semiconductor substrate;

depositing a second insulating layer on an upper surface and an inner surface of the first conductive layer, and the upper surface of the semiconductor substrate;

performing photolithography processing on the second insulating layer to expose the upper surface of the semiconductor substrate, wherein the second insulating layer covers the first insulating layer and the first conductive layer;

depositing a second conductive layer on an upper surface and an inner surface of the second insulating layer, and the upper surface of the semiconductor substrate;

etching the semiconductor substrate to form at least one second trench in one-to-one correspondence with the at least one first trench in the semiconductor substrate, wherein the second trench penetrates upward through the first insulating layer from a lower surface of the semiconductor substrate to expose the first conductive layer, or the second trench extends upward from a lower surface of the semiconductor substrate to the first insulating layer;

depositing a third insulating layer on the lower surface of the semiconductor substrate and an inner surface of the at least one second trench;

if the second trench penetrates through the first insulating layer, removing the third insulating layer deposited on the bottom of the at least one second trench to expose the first conductive layer, or if the second trench extends to the first insulating layer, removing the third insulating layer deposited on the bottom of the at least one second trench, and removing the first insulating layer deposited on the bottom of the at least one first trench to expose the first conductive layer; and depositing a third conductive layer on a lower surface and an inner surface of the third insulating layer.

15. The method according to claim 14, wherein before etching the semiconductor substrate, the method further comprises:

performing thinning processing on the lower surface of the semiconductor substrate.

16. The method according to claim 15, wherein the method further comprises:
etching the semiconductor substrate to form at least one third trench in the semiconductor substrate, wherein the third trench extends upward from the lower surface of the semiconductor substrate, and a depth of the third trench is less than the thickness of the semiconductor substrate; and
depositing the third insulating layer on an inner surface of the at least one third trench, and depositing the third conductive layer on the inner surface of the third insulating layer.

17. The method according to claim 14, wherein on the upper surface of the semiconductor substrate, the second conductive layer between two adjacent first trenches is electrically connected to the semiconductor substrate.

18. The method according to claim 17, wherein a width of any cross section of the first trench parallel to the surfaces of the semiconductor substrate in the semiconductor substrate is greater than that of the second trench.

19. A method for fabricating a capacitor, comprising:
etching a semiconductor substrate to form at least one first trench in the semiconductor substrate, wherein the first trench is downward from an upper surface of the semiconductor substrate, and a depth of the first trench is less than or equal to a thickness of the semiconductor substrate;
depositing a first insulating layer on the upper surface of the semiconductor substrate and an inner surface of the at least one first trench;
depositing a first conductive layer on an upper surface and an inner surface of the first insulating layer;
performing photolithography processing on the first insulating layer and the first conductive layer to expose the upper surface of the semiconductor substrate;
depositing a second insulating layer on an upper surface and an inner surface of the first conductive layer, and the upper surface of the semiconductor substrate;
performing photolithography processing on the second insulating layer to expose the upper surface of the semiconductor substrate, wherein the second insulating layer covers the first insulating layer and the first conductive layer;
depositing a second conductive layer on an upper surface and an inner surface of the second insulating layer, and the upper surface of the semiconductor substrate;
depositing a third insulating layer on a lower surface of the semiconductor substrate;
removing the third insulating layer under the at least one first trench to expose the first conductive layer; and
depositing a third conductive layer on a lower surface and an inner surface of the third insulating layer.

20. The method according to claim 19, wherein when the depth of the first trench is less than the thickness of the semiconductor substrate, the method further comprises:
performing thinning processing on the lower surface of the semiconductor substrate before depositing the third insulating layer on the lower surface of the semiconductor substrate.

* * * * *